United States Patent
Qiu et al.

(10) Patent No.: US 12,119,810 B2
(45) Date of Patent: Oct. 15, 2024

(54) GATE DRIVER SYSTEM FOR DETECTING A SHORT CIRCUIT CONDITION

(71) Applicant: Infineon Technologies Austria AG, Villach (AT)

(72) Inventors: Yuqiang Qiu, Qingdao (CN); Bin Tian, Shanghai (CN)

(73) Assignee: Infineon Technologies Austria AG, Neubiberg (DE)

( * ) Notice: Subject to any disclaimer, the term of this patent is extended or adjusted under 35 U.S.C. 154(b) by 213 days.

(21) Appl. No.: 17/933,615

(22) Filed: Sep. 20, 2022

(65) Prior Publication Data

US 2024/0097669 A1 Mar. 21, 2024

(51) Int. Cl.
| | |
|---|---|
| *H02K 17/32* | (2006.01) |
| *G01R 31/52* | (2020.01) |
| *H02J 7/00* | (2006.01) |
| *H02M 7/5387* | (2007.01) |
| *H02P 27/08* | (2006.01) |
| *H03K 17/081* | (2006.01) |

(52) U.S. Cl.
CPC ....... *H03K 17/08104* (2013.01); *G01R 31/52* (2020.01); *H02J 7/007* (2013.01); *H02M 7/5387* (2013.01); *H02P 27/08* (2013.01)

(58) Field of Classification Search
CPC ...... H02P 27/08; H02P 29/0241; H02P 27/04; H03K 17/08104; G01R 31/52; H02M 7/5387
See application file for complete search history.

(56) References Cited

U.S. PATENT DOCUMENTS

| 11,923,832 B1 * | 3/2024 | Xu ....................... H03K 17/063 |
| 2018/0234088 A1 * | 8/2018 | Narayanasamy ........ H02H 7/20 |

\* cited by examiner

*Primary Examiner* — Karen Masih
(74) *Attorney, Agent, or Firm* — Harrity & Harrity, LLP

(57) ABSTRACT

A driver system includes a first half-bridge that generates a first load current at a first output node, a second half-bridge that generates a second load current at a second output node, a first voltage charging device coupled to the first output node, and a second voltage charging device coupled to the second output node. A method of detecting a short circuit condition in the driver system includes detecting a first charging time at which a first charging voltage of the first voltage charging device is charged to a first threshold voltage; detecting a second charging time at which a second charging voltage of the second voltage charging device is charged to a second threshold voltage; and detecting the short circuit condition on a condition that a time difference between the first charging time and the second charging time is less than a time difference threshold.

29 Claims, 10 Drawing Sheets

GATE DRIVER SYSTEM FOR DETECTING A SHORT CIRCUIT CONDITION

BACKGROUND

Many functions of modern devices in automotive, consumer, and industrial applications, such as driving an electric motor or an electric machine, rely on power semiconductor devices. For example, Insulated Gate Bipolar Transistors (IGBTs), Metal Oxide Semiconductor Field Effect Transistors (MOSFETs), and diodes, to name a few, have been used for various applications including, but not limited to switches in power supplies and power converters.

Usually, a power inverter is composed by two complementary transistors (e.g., a high-side transistor and a low-side transistor) for each motor phase, where the two complementary transistors form a half-bridge to drive an output pad connected to a motor winding. A gate driver, used for driving the two complementary transistors, is supplied with a fixed positive voltage by a positive supply rail and a fixed negative voltage by a negative supply rail. The positive supply rail is connected to the output pad via the high-side transistor of the two complementary transistors to supply load current to the motor winding and the negative supply rail is connected to the output pad via the low-side transistor of the two complementary transistors to sink load current from the motor winding. The two complementary transistors are complementary turned on and off to avoid cross-conduction.

The load current, also referred to as a motor phase current, may be controlled by a control electrode, sometimes referred to as gate electrode. For example, upon receiving a corresponding control signal from the gate driver, the control electrode may set its transistor in one of a conducting state or a blocking state. The amplitude of the control signal for each transistor may be varied to drive the two complementary transistors between switching states. Doing so, in turn, drives the motor. For example, a gate-source voltage Vgs of a MOSFET is typically driven down to approximately zero to turn off the MOSFET and is typically driven to a maximum value to fully turn on the MOSFET. For this reason, the gate-source voltage Vgs may be referred to as a control voltage.

During a running operation, a motor may be driven according to a motor control algorithm to achieve a desired motor speed corresponding to an electrical frequency of the control signals.

SUMMARY

One or more implementations provide a driver system configured to drive a motor. The driver system includes: a first half-bridge circuit comprising a first high-side transistor and a first low-side transistor coupled at a first output node, wherein the first high-side transistor and the first low-side transistor are configured to cooperatively generate a first load current at the first output node for driving the motor; a second half-bridge circuit comprising a second high-side transistor and a second low-side transistor coupled at a second output node, wherein the second high-side transistor and the second low-side transistor are configured to cooperatively generate a second load current at the second output node for driving the motor; a first voltage charging device coupled to a first power supply and to the first output node; a second voltage charging device coupled to a second power supply and to the second output node; and a diagnostic circuit configured to monitor a first charging voltage of the first voltage charging device and a second charging voltage of the second voltage charging device, detect a first charging time at which the first charging voltage is charged to a first threshold voltage, detect a second charging time at which the second charging voltage is charged to a second threshold voltage, and detect a short circuit condition on a condition that a time difference between the first charging time and the second charging time is less than a time difference threshold.

One or more implementations provide a method of detecting a short circuit condition in a driver system that includes a first half-bridge circuit configured to generate a first load current at a first output node, a second half-bridge circuit configured to generate a second load current at a second output node, a first voltage charging device coupled to a first power supply and to the first output node, and a second voltage charging device coupled to a second power supply and to the second output node. The method includes: monitoring a first charging voltage of the first voltage charging device and a second charging voltage of the second voltage charging device; detecting a first charging time at which the first charging voltage is charged to a first threshold voltage; detecting a second charging time at which the second charging voltage is charged to a second threshold voltage; and detecting the short circuit condition on a condition that a time difference between the first charging time and the second charging time is less than a time difference threshold.

BRIEF DESCRIPTION OF THE DRAWINGS

Implementations are described herein making reference to the appended drawings.

DETAILED DESCRIPTION

Figure 1:
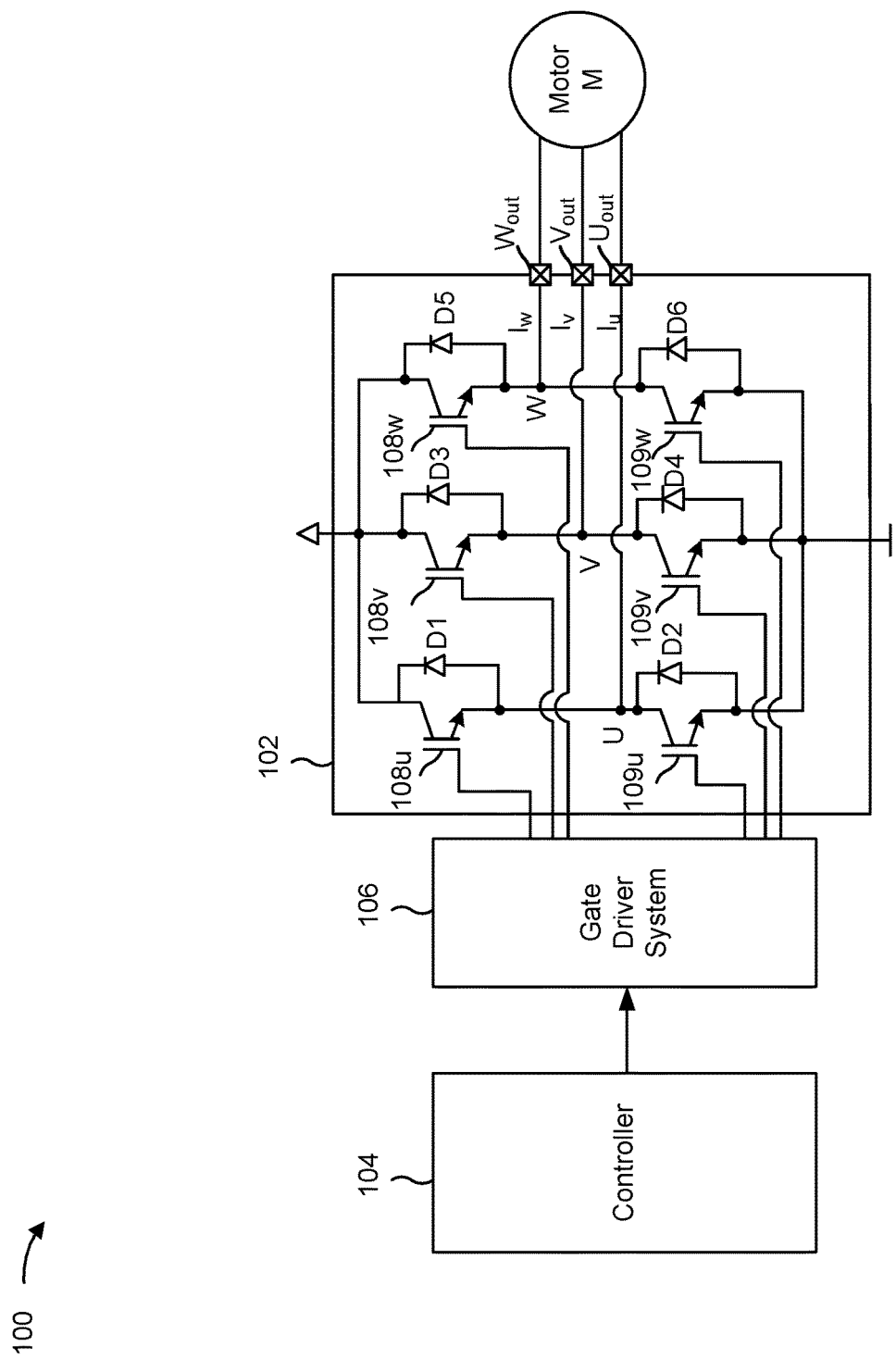
FIG. 1 illustrates a schematic block diagram illustrating a motor control system according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to the orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances (e.g., within 5%) that are deemed acceptable in the industry without departing from the aspects of the implementations described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A power transistor, also referred to as a power switch or a transistor switch, is a power semiconductor device that may be used to drive a load current. The power transistor includes a first load terminal (e.g., a source or an emitter) and a second load terminal (e.g., a drain or a collector). Additionally, a load current path of the power transistor may be controlled by a control electrode, sometimes referred to as a gate, connected to a control terminal of the power transistor. A load current path of the power transistor is a gate-controlled conductive channel whose conductivity is controlled by a control voltage applied to the control electrode of the power transistor. For example, the power transistor can be turned "on" or "off" by activating and deactivating its control electrode. For example, applying a positive voltage across a gate and a source of a Metal Oxide Semiconductor Field Effect Transistor (MOSFET) will keep the MOSFET in its "on" state, while applying a voltage of approximately zero or slightly negative across the gate and the source of the MOSFET will cause the MOSFET to turn "off."

There is a turn-on process and a turn-off process for switching a transistor on and off. During the turn-on process of an n-channel transistor, a gate driver may be used to provide (source) a gate current (e.g., an ON current) to a gate of the n-channel transistor in order to charge a gate voltage to a sufficient voltage to turn on the n-channel transistor. In contrast, during the turn-off process of the n-channel transistor, the gate driver is used to draw (sink) a gate current (e.g., an OFF current) from the gate of the n-channel transistor in order to discharge the gate voltage sufficiently to turn off the n-channel transistor. A voltage pulse may be output from the gate driver as a control signal according to a pulse-width modulation (PWM) scheme. Thus, the control signal may be switched between an ON voltage level and an OFF voltage level during a PWM cycle for controlling the n-channel transistor. This in turn charges and discharges the gate voltage to turn on and off the n-channel transistor, respectively.

The opposite is true for a p-channel transistor. The gate driver may be used to draw (sink) a gate current (e.g., an ON current) from a gate of the p-channel transistor in order to discharge the gate voltage to a sufficient voltage to turn on the p-channel transistor. In contrast, during the turn-off process of the p-channel transistor, the gate driver is used to provide (source) a gate current (e.g., an OFF current) to the gate of the p-channel transistor in order to charge the gate voltage of the p-channel transistor sufficiently to turn off the p-channel transistor. A control signal applied to the gate of the p-channel transistor may be switched between an ON voltage level and an OFF voltage level during a PWM cycle for controlling the p-channel transistor. This in turn charges and discharges the gate voltage to turn on and off the p-channel transistor, respectively.

For both n-channel and p-channel transistors, the n-channel and p-channel transistors are off when the gate-source voltage Vgs is approximately a zero value or below a threshold voltage and the n-channel and p-channel transistors are on when the gate-source voltage Vgs is equal to or greater than the threshold voltage.

For driving a load in this manner, two transistors are typically arranged in a half-bridge configuration, including a high-side transistor and a low-side transistor. The high-side transistor may be a p-channel transistor connected to a high-side supply potential and the low-side transistor may be an n-channel transistor connected to a low-side supply potential. In some implementations, the high-side transistor and the low-side transistor may be of a same transistor type (e.g., both n-channel type or both p-channel type).

A load current is said to be a positive load current when the load current is flowing from a half-bridge towards the load and a load current is said to be negative when the load current is flowing away from the load towards the half-bridge. A high-side transistor, when on, is responsible for conducting a positive load current in order to source the load current to the load while its complementary, low-side transistor is turned off (e.g., the low-side transistor is in blocking or high impedance mode). In order to sink load current from the load, the roles of the high-side and low-side transistors are reversed. Here, the low-side transistor, when on, is responsible for conducting a negative load current in order to sink the load current from the load while its complementary, high-side transistor is turned off (e.g., the high-side transistor is in blocking or high impedance mode). The two complementary transistors are typically switched such that both are not turned on at the same time.

Transistors may include Insulated Gate Bipolar Transistors (IGBTs) and Metal Oxide Semiconductor Field Effect Transistors (MOSFETs) (e.g., Si MOSFETs or SiC MOSFETs), among other examples. It will be appreciated that that one type of transistor may be substituted for another type of transistor. In this context, when substituting a MOSFET for an IGBT, the MOSFET's drain may be substituted for the IGBT's collector, the MOSFET's source may be substituted for the IGBT's emitter, the MOSFETs drain-source voltage Vds may be substituted for the IGBT's collector-emitter voltage Vce, and the MOSFET's gate-source voltage Vgs may be substituted for the IGBT's gate-emitter voltage Vge, or vice versa, in any one of the examples described herein.

Some implementations described in this disclosure pertain to, without being limited thereto, half-bridges used for driving electric motors. For example, a multi-phase inverter, as a type of power inverter, is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carries an alternating current (AC) of the same frequency and voltage amplitude relative to a common reference but with a phase difference of one third of a driving cycle. Due to the phase difference, a voltage on any of the three conductors reaches its voltage peak at one third of the driving cycle, with the voltage peaks of the three conductors being distributed from each other within the driving cycle with a substantially equal phase delay. This phase delay gives constant power transfer to a balanced linear load. It also makes it possible to produce a rotating magnetic field in an electric motor.

A three-phase inverter includes three inverter legs, one for each of the three phases, and each inverter leg is connected to a direct current (DC) voltage source in parallel to each other. Each inverter leg includes a pair of transistors arranged in a half-bridge configuration for converting DC to AC, for driving a phase load, as described above. However, multi-phase inverters are not limited to three phases, and may include two phases or more than three phases, with an inverter leg for each phase. In some instances, two half-bridges may be connected as an H-bridge circuit with the load (e.g., the motor) connected as a crossbar between the two half-bridges as a single-phase load.

A short circuit, also referred to as a phase short, may occur involving two half-bridges, when a high-side transistor of a first half-bridge and a low-side transistor of a second half-bridge are turned on. For example, a short circuit inside or outside a motor housing of the motor can occur when output pads of the first and the second half-bridges are connected together with low inductance (e.g., by a direct connection). Here, "low inductance" means that the output pads of the first and the second half-bridges are not connected by respective motor windings of the motor. This can cause a large current to flow in the high-side transistor of the first half-bridge and the low-side transistor of the second half-bridge that have been shorted together.

To detect such a short circuit condition, one possible approach is to monitor the voltage on a shunt resistor connected between a low-side power transistor of a power inverter and the negative supply rail. When the power inverter includes multiple half-bridges, each low-side power transistor can be connected to the negative supply rail by the shunt resistor so that respective load currents flow through the shunt resistor. Once a short circuit occurs, there will be high peak voltage on the shunt resistor caused by short circuit current. However, with this method, the short circuit condition is detected only after the short circuit occurs while one of the high-side transistors conducts load current. As a result, this method does not fully protect the high-side transistor or the low-side transistor that are turned on at the time the short circuit occurs. Allowing the high-side transistor and the low-side transistor to conduct such high currents prior to performing any intervening action (e.g., emergency shutdown) may be too late to prevent damage to the high-side transistor and the low-side transistor or conducting such high currents may have an overall negative impact on the lifetime of the high-side transistor and the low-side transistor.

Accordingly, some implementations disclosed herein are directed to a gate driver system capable of diagnosing short circuit conditions and preventing short circuits from occurring, thereby avoiding damage to the transistors of the power inverter.

One or more implementations is directed to a driver system configured to drive a motor. The driver system includes a first half-bridge circuit, a second half-bridge circuit, a first voltage charging device, a second voltage charging device, and a diagnostic circuit. The first half-bridge circuit includes a first high-side transistor and a first low-side transistor coupled at a first output node, where the first high-side transistor and the first low-side transistor are configured to cooperatively generate a first load current at the first output node for driving the motor. The second half-bridge circuit includes a second high-side transistor and a second low-side transistor coupled at a second output node, where the second high-side transistor and the second low-side transistor are configured to cooperatively generate a second load current at the second output node for driving the motor. The first voltage charging device is coupled to a first power supply and to the first output node. The second voltage charging device is coupled to a second power supply and to the second output node. The diagnostic circuit is configured to monitor a first charging voltage of the first voltage charging device and a second charging voltage of the second voltage charging device, detect a first charging time at which the first charging voltage is charged to a first threshold voltage, detect a second charging time at which the second charging voltage is charged to a second threshold voltage, and detect a short circuit condition on a condition that a time difference between the first charging time and the second charging time is less than a time difference threshold.

FIG. 1 illustrates a schematic block diagram illustrating a motor control system 100 according to one or more implementations. In particular, the motor control system 100 includes a power inverter 102, a controller 104, and a gate driver system 106. The controller 104 and the gate driver system 106 operate together as a motor control unit. In some implementations, the motor control unit may be a monolithic integrated circuit (IC) with the controller 104 and the gate driver system 106 being arranged on a single IC. In some implementations, the motor control unit may be divided into two or more ICs, for example, with the controller 104 being arranged on a first IC and the gate driver system 106 being arranged on one or more second ICs. It will be appreciated that, while implementations described herein are directed to driving a motor, the concepts described herein may be extended to other types of inductive loads and are not limited to motors.

The motor control system 100 is further coupled to a motor M (e.g., a permanent magnet synchronous motor (PMSM) as a type of AC motor), that includes three phases U, V, and W. The power inverter 102 in this example is a three-phase voltage generator configured to provide three-phase power by supplying three phase voltages to drive the motor M.

Deviations in both magnitude and phase may cause a loss in power and torque in the motor M. Therefore, the controller 104 may be configured to monitor and control the magnitude and phase of the voltages supplied to the motor M in real-time to ensure the proper current balance is maintained based on a feedback control loop.

The power inverter 102 for the motor M includes a switching array of six transistors 108$u$, 108$v$, 108$w$, 109$u$, 109$v$, and 109$w$ arranged in complementary pairs. Each complementary pair forms a half-bridge circuit and constitutes one inverter leg that supplies a phase voltage to the motor M. Thus, each inverter leg includes a high-side transistor 108$u$, 108$v$, or 108$w$ and a low-side transistor 109$u$, 109$v$, or 109$w$. Additionally, each transistor 108$u$, 108$v$, 108$w$, 109$u$, 109$v$, and 109$w$ may be connected antiparallel to a corresponding freewheeling diode D1-D6. The freewheeling diodes D1-D6 provide an alternative current path for the load current during turn off of a respective transistor 108$u$, 108$v$, 108$w$, 109$u$, 109$v$, and 109$w$ in order to prevent high voltage peaks and losses. For example, the freewheeling diode D1 provides an alternative current path with respect to the high-side transistor 108$u$ during the turn off of the high-side transistor 108$u$. Similarly, the freewheeling diode D2 provides an alternative current path with respect to the low-side transistor 109$u$ during the turn off of the low-side transistor 109$u$.

Load current paths U, V, and W extend from an output pad Uout, Vout, or Wout of each inverter leg (e.g., the output of each half-bridge circuit) located between complementary transistors and are configured to be coupled to a load, such as the motor M. Each load current path U, V, and W carries a corresponding phase current Iu, Iv, and Iw. Each phase current Iu, Iv, and Iw has an AC electrical frequency that directly corresponds to the actual motor speed of the motor M.

The power inverter 102 is coupled to a DC power supply (e.g., a battery or a diode bridge rectifier) and to the gate driver system 106.

The controller 104, which may be a microcontroller or another hardware-based controller, performs a motor control function of the motor control system 100 in real-time (or near real-time) and transmits PWM control signals to a gate driver system 106. The controller 104 may employ a PWM scheme for controlling the states of each transistor, and, ultimately, each phase current provided on the respective load current paths U, V, and W. The gate driver system 106 generates driver signals based on the PWM control signals for controlling the switching states (e.g., on and off states) of the transistors 108$u$, 108$v$, 108$w$, 109$u$, 109$v$, and 109$w$. Thus, load current paths U, V, and W may be controlled by the controller 104 and the gate driver system 106 by controlling the control electrodes (e.g., gate electrodes) of the transistors 108$u$, 108$v$, 108$w$, 109$u$, 109$v$, and 109$w$. For example, upon receiving a PWM control signal from the controller 104, the gate driver system 106 may set a corresponding transistor 108$u$, 108$v$, 108$w$, 109$u$, 109$v$, or 109$w$ in one of a conducting state (e.g., on-state) or a blocking state (e.g., off-state).

The gate driver system 106 may include one or more gate drivers for driving the transistors 108$u$, 108$v$, 108$w$, 109$u$, 109$v$, and 109$w$ between switching states. For example, the gate driver system 106 may include a gate driver for each half-bridge circuit. The gate driver system 106 may be configured to receive instructions, including the PWM control signals, from the controller 104, and respectively turn on and turn off the transistors 108$u$, 108$v$, 108$w$, 109$u$, 109$v$, and 109$w$ in accordance with the received instructions and the control signals. For example, during the turn-on process of a transistor 108$u$, 108$v$, 108$w$, 109$u$, 109$v$, or 109$w$, the gate driver system 106 may be used to provide (source) a gate current to a gate of the transistor 108$u$, 108$v$, 108$w$, 109$u$, 109$v$, or 109$w$ to charge the gate. In contrast, during the turn-off process, the gate driver system 106 may be used to draw (sink) a gate current from the gate of the transistor 108$u$, 108$v$, 108$w$, 109$u$, 109$v$, or 109$w$ to discharge the gate.

Furthermore, the transistors 108$u$, 108$v$, 108$w$, 109$u$, 109$v$, and 109$w$ of the power inverter 102 are controlled so that at no time are both high-side and low-side transistors in the same inverter leg turned on or else the DC power supply would be shorted. This requirement may be met by the complementary operation of the transistors 108$u$, 108$v$, 108$w$, 109$u$, 109$v$, and 109$w$ within an inverter leg according to a motor control algorithm. A dead time may be imposed by the controller 104 during which both the high-side and low-side transistors of the same inverter leg are simultaneously turned off.

During normal operation, the motor M may be driven according to the motor control algorithm to achieve a desired motor speed corresponding to an electrical frequency of the control signals. A short circuit may occur involving two half-bridges, when one of the high-side transistors 108$u$, 108$v$, or 108$w$ of one half-bridge and one of the low-side transistors 109$u$, 109$v$, or 109$w$ of a different half-bridge are turned on. For example, a phase short inside or outside the motor housing of the motor M can occur when the output pads Wout, Vout, or Uout of two half-bridges are connected together with low inductance. This can cause a large current to flow in the high-side transistor 108$u$, 108$v$, or 108$w$ and the low-side transistor 109$u$, 109$v$, or 109$w$ of the two half-bridges that have been shorted together. For example, a short circuit may occur when the high-side transistor 108$u$ and the low-side transistor 109$v$ are turned on and output pads Uout and Vout are shorted together. Should a connection with low inductance, such as a direct connection, between output pads Uout and Vout exist while the high-side transistor 108$u$ and the low-side transistor 109v are turned on, the current flowing through the high-side transistor 108u and the low-side transistor 109v will spike and potentially cause damage to the high-side transistor 108u and the low-side transistor 109v.

Therefore, some implementations, described herein, are directed to detecting this short circuit condition before the short circuit actually occurs and signal the short circuit fault. The short circuit condition is a fault condition to be detected and signaled to the controller 104 so that the controller 104 may take an appropriate action to prevent the short circuit from occurring. Once the short circuit fault is signaled, the controller 104 can prevent the high-side transistors 108u, 108v, and 108w from turning on (e.g., by disabling the switching of the high-side transistors 108u, 108v, and 108w), which prevents the short circuit from occurring. A short circuit can occur only if one of the high-side transistors 108u, 108v, or 108w is turned on. This also prevents the motor M from starting. Once the short circuit condition has been detected, the short circuit condition can be diagnosed and possibly repaired, thereby preventing damage to one or more of the high-side and low-side transistors 108u, 108v, 108w, 109u, 109v, and 109w.

As indicated above, FIG. 1 is provided merely as an example. Other examples are possible and may differ from what was described with regard to FIG. 1. For example, in some implementations, a number of motor phases may be different or two half-bridges may be connected as an H-bridge circuit. In some implementations, additional circuit components may be added without deviating from the disclosure provided above.

Figure 2:
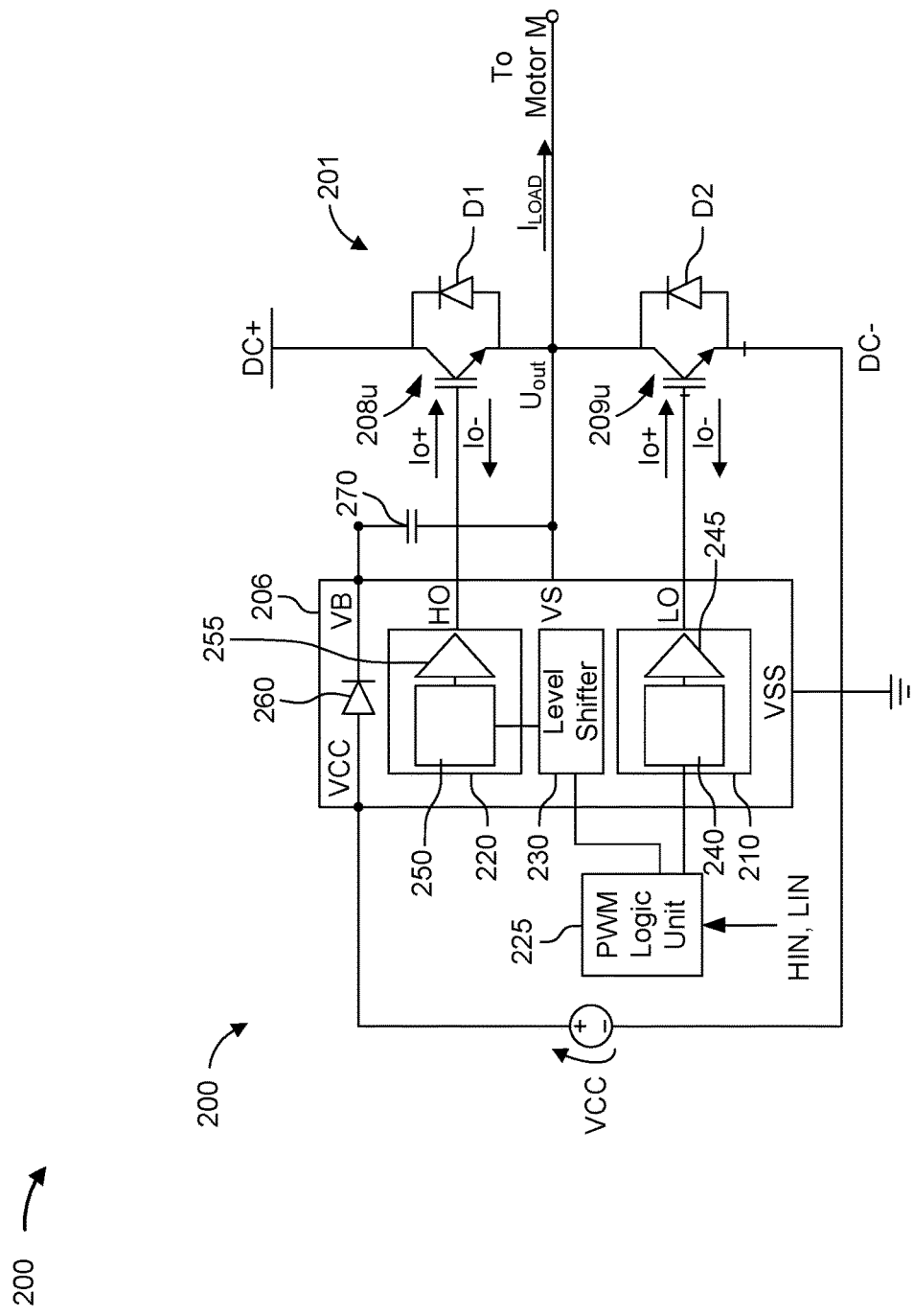
FIG. 2 illustrates a schematic block diagram of a gate driver system according to one or more implementations.

FIG. 2 illustrates a schematic block diagram of a gate driver system 200 according to one or more implementations. The gate driver system 200 may correspond to the gate driver system 106 of FIG. 1. As shown in FIG. 2, the gate driver system 200 includes a single-phase motor drive stage 201 (e.g., an inverter leg or half-bridge circuit) and a gate driver 206 electrically coupled to the single-phase motor drive stage 201. The gate driver system 200 can be duplicated for each inverter leg in the gate driver system 200.

The single-phase motor drive stage 201 includes a high-side transistor 208u and a low-side transistor 209u that are controlled for supplying a load current $I_{LOAD}$ to the motor M. In other words, the single-phase motor drive stage 201 in this example corresponds to a U phase inverter leg of the motor M described with regard to FIG. 1. However, the single-phase motor drive stage 201 could correspond to any inverter leg in the motor control system 100.

The gate driver 206 is a monolithic gate driver, that includes a low-side gate driver 210 used to drive low-side transistor 209u and a high-side gate driver 220 used to drive high-side transistor 208u. Both the low-side and the high-side gate drivers 210 and 220 perform gate driving of their respective low-side transistor 209u and high-side transistor 208u based on the PWM control signal LIN and HIN received from a controller, such as the controller 104.

The PWM control signals are received from the controller 104 at a PWM logic unit 225 of the gate driver 206. The PWM logic unit 225 receives the PWM control signals LIN and HIN signals from the controller 104 and ensures there is a minimum dead time implemented, during which both the high-side transistor 208u and the low-side transistor 209u are simultaneously turned off Eventually, the PWM control signals LIN and HIN are passed on to the respective low-side and high-side gate drivers 210 and 220. In some implementations, the PWM control signal HIN, provided to the high-side gate driver 220, may be passed through a level shifter 230. The level shifter 230 is used to convert (e.g., level shift) the PWM control signal HIN, and thus transfer control information, from a low voltage power domain to a high voltage power domain of the gate driver 206. After this point, the low-side and the high-side gate drivers 210 and 220 perform gate driving.

Both the low-side and the high-side gate drivers 210 and 220 include separate pre-driver circuitries 240 and 250 and buffers 245 and 255, respectively. The pre-driver circuitries 240 and 250 are configured to receive the PWM control signals LIN and HIN signals and, based thereon, control the on/off state of a respective first current source, such as a source Field Effect Transistor (FET), used to generate current Io+. Additionally, the pre-driver circuitries 240 and 250 are configured to receive the PWM control signals LIN and HIN signals and, based thereon, control the on/off state of a respective second current source, such as a sink FET, used to generate current Io−. The respective current sources are provided in buffers 245 and 255. Thus, the buffers 245 and 255 may each include a pair of complementary FETs used to generate turn-on currents Io+ and turn-off currents Io− for the respective low-side transistor 209u and high-side transistor 208u.

Each of the pre-driver circuitries 240 and 250 may further include a regulator that is configured to control the amplitudes of the ON current Io+ and the OFF current Io− via control of the current sources in the buffers 245 and 255. In other words, each regulator commands a respective buffer 245 and 255 to use a certain current capability.

The gate driver 206 may be configured to receive PWM control signals from the controller 104 and turn on or turn off respective high-side and low-side transistors 208u and 209u in accordance with the received PWM control signals. For example, during the turn-on process of the high-side and low-side transistors 208u and 209u, the gate driver 206 may be used to provide (source) a gate current Io+ to the gate of one of the high-side transistor 208u or the low-side transistor 209u to charge the gate. In contrast, during the turn-off process, the gate driver 206 may be used to draw (sink) a gate current Io− from the gate of one of the high-side transistor 208u or the low-side transistor 209u to discharge the gate.

Thus, the controller 104 is electrically coupled to the gate driver 206 for the transmission of information and control signals therebetween, and the gate driver 206 is electrically coupled to the single-phase motor drive stage 201 for driving the high-side and low-side transistors 208u and 209u.

The gate driver system 200 further includes a bootstrap diode 260 to charge a voltage charging device 270. In this case, the voltage charging device 270 is a bootstrap capacitor. However, the voltage charging device 270 may be a chargeable battery or another type of voltage charging device.

In addition, VB refers to a high-side floating supply voltage; VS refers to a high-side floating ground voltage; VCC refers to a low-side fixed supply voltage; VSS refers to a low-side ground voltage; HO refers to an output terminal for a high-side floating output voltage; LO refers to an output terminal for a low-side output voltage; DC+ refers to DC-link positive supply; DC− refers to DC-link negative supply; and HIN and LIN refer to PWM control signals (e.g., logic input voltages) received from the controller 104. The low-side fixed supply voltage VCC also provides power to certain logic components of the gate driver 206 that use a fixed supply voltage to operate and may be used to charge the voltage charging device 270 when the bootstrap diode 260 is forward biased.

Typically, VB=VCC−VS−VD, where VD is a forward bias voltage drop across the bootstrap diode 260. As one example implementation, when the low-side fixed supply voltage VCC is equal to 15V and the high-side floating ground voltage VS is equal to 0V, and the bootstrap diode 260 is forward biased and has a forward bias voltage drop of VD=0.5V, then VB=15V−0V−0.5V=14.5V. That is, during normal operation, the high-side floating supply voltage VB is about 15V above the high-side floating ground voltage VS due to the voltage charging device 270 supplying to a high-side of the gate driver 206. A positive power supply rail that provides the DC-link positive supply DC+ may be in the range of 200-1200V, for example, but is not limited thereto. On top of this, the high-side floating ground voltage VS is equal to DC− (e.g., VSS or 0V) when low-side transistor 209u is on (and high-side transistor 208u is off). A negative power supply rail that provides the DC-link negative supply DC− and may be shorted to VSS, as shown, but need not be. In this case, the high-side floating supply voltage VB is near 15V and the voltage charging device 270 is charged by the low-side fixed supply voltage VCC through the bootstrap diode 260. Otherwise, the high-side floating ground voltage VS is equal to the DC-link positive supply DC+ when the high-side transistor 208u is on (and low-side transistor 209u is off) and the bootstrap diode 260 is reverse biased and non-conducting. In the case where the bootstrap diode 260 is reverse biased, the high-side floating supply voltage VB is 15V above the DC-link positive supply DC+ and the voltage charging device 270 is slowly discharging. It will be appreciated that certain circuit values and device parameters used herein serve as examples for illustrative purposes for one or more possible implementations out of many possible implementations and are not to be treated as limiting or required in any way unless explicitly stated.

The aforementioned voltages are set such that a high-side voltage domain of the gate driver 206 operates in a higher voltage or power domain than that of a low-side voltage domain of the gate driver 206. For example, the low-side fixed supply voltage VCC may be set to 15V and the high-side floating supply voltage VB may be operated at a maximum voltage of 1215V when the DC-link positive supply DC+ is 1200V.

The gate driver 206 is configured to receive instructions from the controller 104 to drive a motor phase (e.g., single-phase motor drive stage 201) connected to the high-side floating ground voltage VS using the PWM control signals. These PWM control signals, depicted as PWM control signals HIN and LIN, are received by the gate driver 206 and passed through to the high-side gate driver 220 and the low-side gate driver 210 via the appropriate logic (e.g., the PWM logic unit 225 for the low-side gate driver 210 and the level shifter 230 for the high-side gate driver 220). The low-side gate driver 210 is configured to receive the PWM control signal LIN and the high-side gate driver 220 is configured to receive the PWM control signal HIN and drive the low-side transistor 209u and the high-side transistor 208u, respectively, using output terminals HO and LO of the gate driver 206.

As indicated above, FIG. 2 is provided merely as an example. Other examples are possible and may differ from what was described with regard to FIG. 2. For example, in some implementations, the high-side gate driver 220 may receive PWM control signals directly from the controller 104. In some implementations, the bootstrap diode 260 may be located external to the gate driver 206. In some implementations, the low-side ground voltage VSS may be connected to a supply potential different than a ground potential.

In some implementations, additional circuit components may be added without deviating from the disclosure provided above.

Figure 3A:
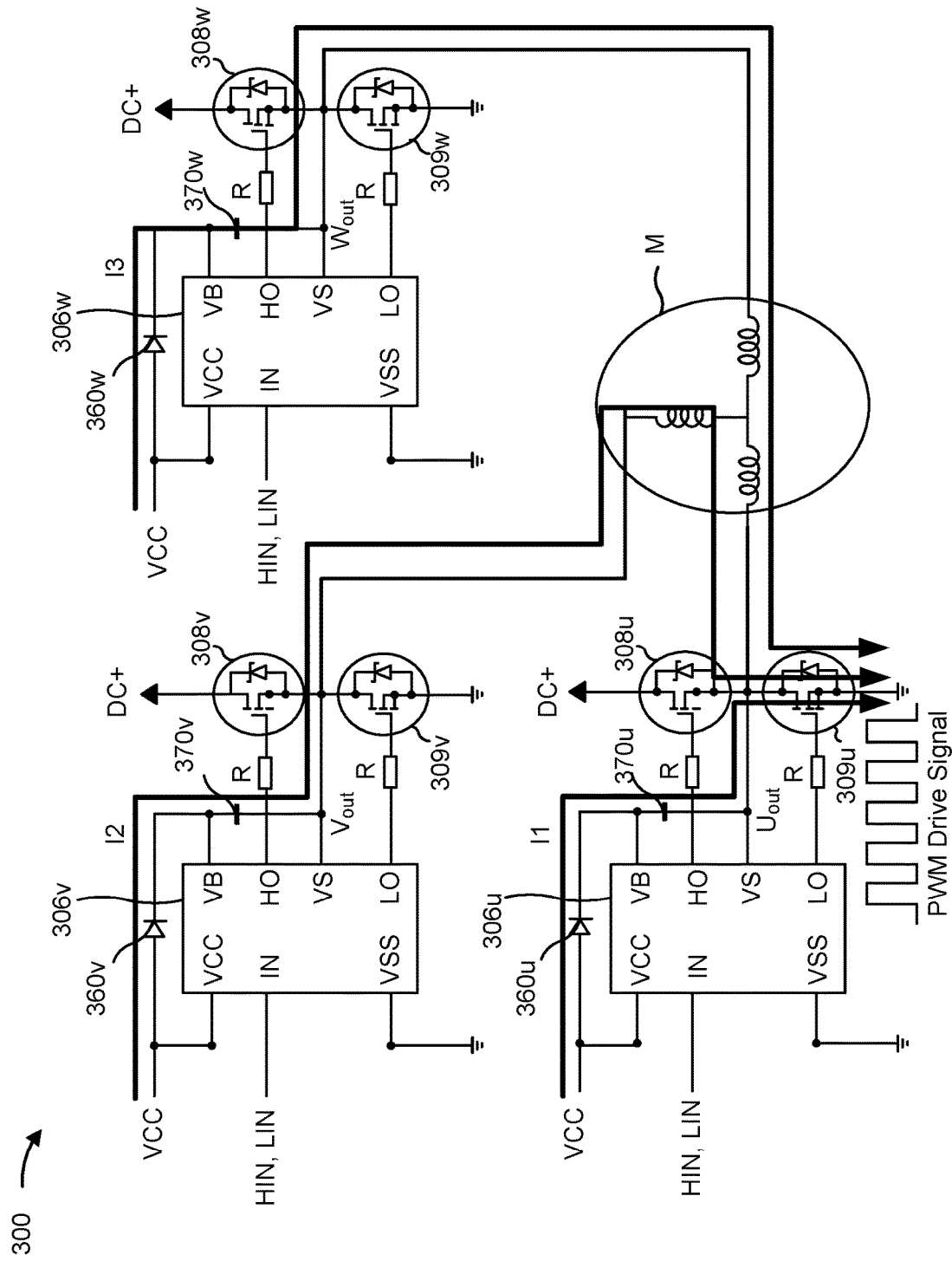
FIG. 3A illustrates a schematic diagram of a multi-phase gate driver system according to one or more implementations.

FIG. 3A illustrates a schematic diagram of a multi-phase gate driver system 300 according to one or more implementations. The multi-phase gate driver system 300 may correspond to the gate driver system 106 of FIG. 1 and/or the gate driver system 200 of FIG. 2. As shown in FIG. 3A, the multi-phase gate driver system 300 includes three single-phase motor drive stages (e.g., inverter legs or half-bridge circuits), each of which is respectively driven by one of three gate drivers 306u, 306v, and 306w. Specifically, gate driver 306u generates gate control signals to drive transistors 308u and 309u between switching states based on the PWM control signals HIN and LIN received at an input terminal IN; gate driver 306v generates gate control signals to drive transistors 308v and 309v between switching states based on the PWM control signals HIN and LIN received at an input terminal IN; and gate driver 306w generates gate control signals to drive transistors 308w and 309w between switching states based on the PWM control signals HIN and LIN received at an input terminal IN.

Resistors R are used to connect each output terminal HO and LO of the gate drivers 306u, 306v, and 306w to a gate of a respective transistor 308u, 308v, 308w, 309u, 309v, and 309w for carrying gate control signals. The resistive values of the resistors R may be between 10 and 200 ohms, but are not limited thereto. The gate control signals may be set to a high signal level to turn on a transistor and may be set to a low signal level to turn off a transistor. As a result, the gate control signals may be referred to as varying drive signals. For example, the gate control signals may be PWM drive signals that switch between high and low signal levels according to a PWM duty cycle. During a running mode of the motor, the gate control signals may be generated as PWM drive signals.

In addition, each gate driver is associated with a bootstrap diode and a voltage charging device. Bootstrap diode 360u and voltage charging device 370u correspond to gate driver 306u. The voltage charging device 370u is coupled to a power supply VCC via the bootstrap diode 360u. One terminal of the voltage charging device 370u is coupled to the high-side floating supply voltage VB of the gate driver 306u and the other terminal of the voltage charging device 370u is coupled to the high-side floating ground voltage VS of the gate driver 306u, which is also coupled to the output pad Uout of the gate driver 306u. Accordingly, the voltage across the voltage charging device 370u may be referred to as a charging voltage Vbs_U. As the voltage charging device 370u is charged, the charging voltage Vbs_U increases up to a maximum voltage level (e.g., VCC−VD). As the voltage charging device 370u is discharged, the charging voltage Vbs_U decreases down to a minimum voltage level (e.g., 0V).

Similarly, bootstrap diode 360v and voltage charging device 370v correspond to gate driver 306v. The voltage charging device 370v is coupled to a power supply VCC via the bootstrap diode 360v. One terminal of the voltage charging device 370v is coupled to the high-side floating supply voltage VB of the gate driver 306v and the other terminal of the voltage charging device 370v is coupled to the high-side floating ground voltage VS of the gate driver 306v, which is also coupled to the output pad Vout of the gate driver 306v. Accordingly, the voltage across the voltage charging device 370v may be referred to as a charging voltage Vbs_V. As the voltage charging device 370v is charged, the charging voltage Vbs_V increases up to a maximum voltage level (e.g., VCC−VD). As the voltage charging device 370v is discharged, the charging voltage Vbs_V decreases down to a minimum voltage level (e.g., 0V).

Likewise, bootstrap diode 360w and voltage charging device 370w correspond to gate driver 306w. The voltage charging device 370w is coupled to a power supply VCC via the bootstrap diode 360w. One terminal of the voltage charging device 370w is coupled to the high-side floating supply voltage VB of the gate driver 306w and the other terminal of the voltage charging device 370w is coupled to the high-side floating ground voltage VS of the gate driver 306w, which is also coupled to the output pad Uout of the gate driver 306w. Accordingly, the voltage across the voltage charging device 370w may be referred to as a charging voltage Vbs_W. As the voltage charging device 370w is charged, the charging voltage Vbs_W increases up to a maximum voltage level (e.g., VCC−VD). As the voltage charging device 370w is discharged, the charging voltage Vbs_W decreases down to a minimum voltage level (e.g., 0V).

During a short circuit diagnostic operation, the gate drivers 306u, 306v, and 306w maintain the high-side transistors 308u, 308v, and 308w in an off state to prevent an actual short circuit from occurring. In addition, during a short circuit diagnostic operation, two of the low-side transistors 309u, 309v, and 309w are maintained off and one of the low-side transistors is switched on and off by a varying drive signal (e.g., a PWM drive signal). In other words, only one of the six transistors of transistors 308u, 308v, 308w, 309u, 309v, and 309w is being switched on and off and the other five transistors of transistors 308u, 308v, 308w, 309u, 309v, and 309w are maintained off. In this example, the gate of the low-side transistor 309u receives a PWM drive signal as its gate control signal and the other transistors 308u, 308v, 308w, 309v, and 309w receive gate control signals set to a low signal level. As a result, current paths for currents I1, I2, and I3 are established as shown, which enable the voltage charging devices 370u, 370v, and 370w to be charged from a respective minimum voltage level to a respective maximum voltage level.

FIG. 3A illustrates a normal operating condition during which no short circuit condition is present (e.g., none of the output pads Uout, Vout, or Wout are directly connected together). In this case, current I1 flows from voltage charging device 370u through low-side transistor 309u, current I2 flows from voltage charging device 370v and through low-side transistor 309u via the motor M, and current I3 flows from voltage charging device 370w and through low-side transistor 309u via the motor M. The voltage charging device 370u charges at a faster rate than the voltage charging devices 370v and 370w because current I1 has a shorter current path and does need to pass through any motor windings of the motor M. In other words, the voltage charging device 370u, 370v, or 370w that is associated with the low-side transistor 309u, 309v, or 309w that receives the PWM drive signal can charge faster than the other voltage charging devices 370u, 370v, and 370w. In addition, in the absence of a short circuit condition, a charging time of the voltage charging device 370u, 370v, or 370w that is associated with the low-side transistor 309u, 309v, or 309w that receives the PWM drive signal can occur earlier than the charging times of the other voltage charging devices 370u, 370v, and 370w by at least a predetermined margin or time difference.

Here, a "charging time" refers to an amount of time it takes for one of the voltage charging devices 370u, 370v, and 370w to charge from a minimum voltage level to a respective threshold voltage. The threshold voltages of the voltage charging devices 370u, 370v, and 370w may be the same or may be different depending on device parameters, such as capacitance of the voltage charging devices 370u, 370v, and 370w. A threshold voltage may be, for example, a predetermined percentage (e.g., 70-95%) of a respective maximum voltage level of the voltage charging devices 370u, 370v, and 370w.

As indicated above, FIG. 3A is provided merely as an example. Other examples are possible and may differ from what was described with regard to FIG. 3A. For example, in some implementations, the gate drivers 306u, 306v, and 306w may be arranged on a same IC. In some implementations, additional circuit components may be added without deviating from the disclosure provided above.

Figure 3B:
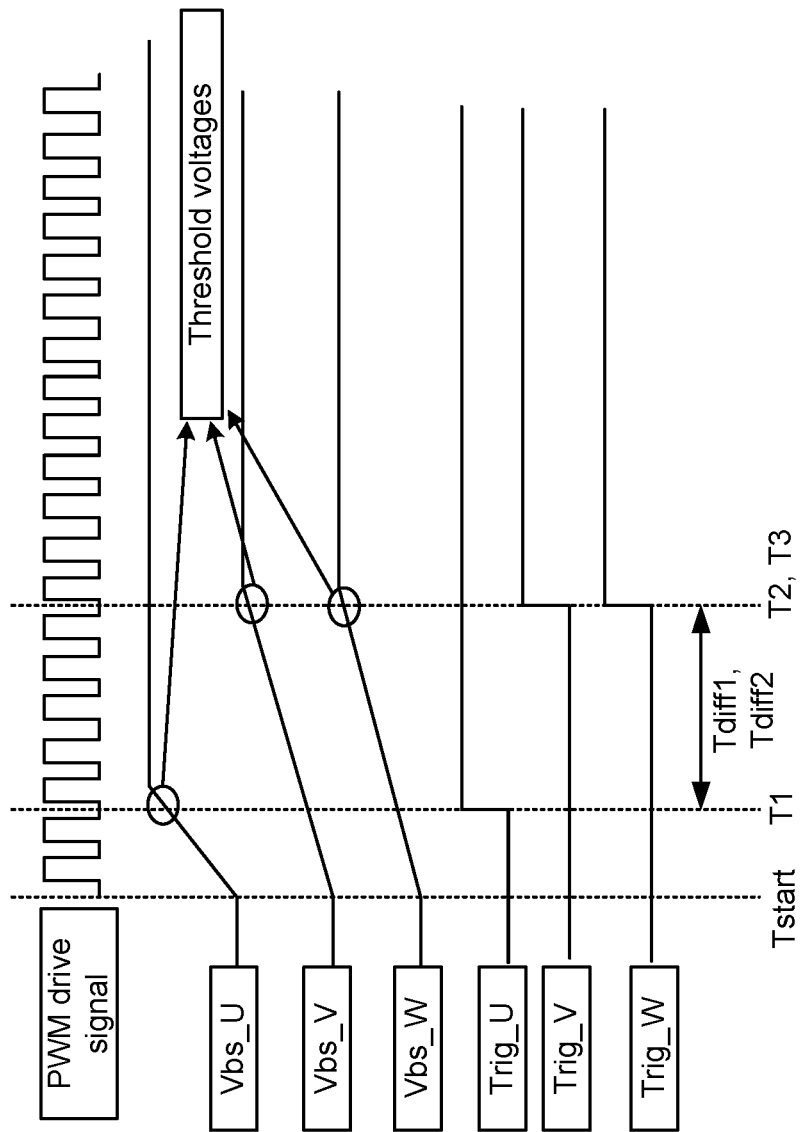
FIG. 3B illustrates a signal diagram of various signals present during a short circuit diagnostic operation according to an implementation illustrated in FIG. 3A during which no short circuit condition is present.

FIG. 3B illustrates a signal diagram of various signals present during a short circuit diagnostic operation according to an implementation illustrated in FIG. 3A during which no short circuit condition is present. At the top, the PWM drive signal applied to one of the low-side transistors is 309u, 309v, or 309w is shown. In this example, the PWM drive signal is applied to the gate of the low-side transistor 309u. As a result, a charging time of the voltage charging device 370u is fastest and occurs earlier than the charging times of the voltage charging devices 370v and 370w by at least a predetermined margin in the absence of a short circuit condition. The short circuit diagnostic operation starts at start time Tstart, which also is the time when the PWM drive signal is initialized. Once the PWM drive signal is initialized, the voltage charging devices 370u, 370v, and 370w start to charge from a minimum voltage level to a maximum voltage level.

The charging voltages Vbs_U, Vbs_V, and Vbs_W of voltage charging device 370u, 370v, or 370w, respectively, are shown. Charge time signals Trig_U, Trig_V, and Trig_W are triggered when a respective charging voltage Vbs_U, Vbs_V, or Vbs_W is charged to a respective threshold voltage. For example, a diagnostic circuit may monitor the charging voltage Vbs_U to detect a first charging time T1 of the voltage charging device 370u by measuring the charging voltage Vbs_U and comparing the charging voltage Vbs_U with a first threshold voltage. The diagnostic circuit may detect a first charging time T1 at which the charging voltage Vbs_U is charged to the first threshold voltage. The charge time signal Trig_U may be toggled from a first signal level to a second signal level at the first charging time T1, indicated by a signal transition, in response to the charging voltage Vbs_U satisfying the first threshold voltage (e.g., the charging voltage Vbs_U becoming equal to the first threshold voltage). The signal transition from the first signal level to the second signal level may be performed, for example, as a rising edge signal transition, a falling edge signal transition, or a signal pulse.

Similarly, the diagnostic circuit may monitor the charging voltage Vbs_V to detect a second charging time T2 of the voltage charging device 370v by measuring the charging voltage Vbs_V and comparing the charging voltage Vbs_V with a second threshold voltage. In some implementations, the first and second threshold voltages may be the same. In some implementations, the first and second threshold voltages may be different. The diagnostic circuit may detect a second charging time T2 at which the charging voltage Vbs_V is charged to the second threshold voltage. The charge time signal Trig_V may be toggled from the first signal level to the second signal level at the second charging time T2, indicated by a signal transition, in response to the charging voltage Vbs_V satisfying the second threshold voltage (e.g., the charging voltage Vbs_V becoming equal to the second threshold voltage). The signal transition from the first signal level to the second signal level may be performed, for example, as a rising edge signal transition, a falling edge signal transition, or a signal pulse.

Similarly, the diagnostic circuit may monitor the charging voltage Vbs_W to detect a third charging time T3 of the voltage charging device 370w by measuring the charging voltage Vbs_W and comparing the charging voltage Vbs_W with a third threshold voltage. In some implementations, the third threshold voltage may be equal to the first and second threshold voltages. In some implementations, one or more of the first, second, and the third threshold voltage may be different from the other threshold voltages. The diagnostic circuit may detect a third charging time T3 at which the charging voltage Vbs_W is charged to the third threshold voltage. The charge time signal Trig_W may be toggled from the first signal level to the second signal level at the second charging time T3, indicated by a signal transition, in response to the charging voltage Vbs_W satisfying the third threshold voltage (e.g., the charging voltage Vbs_W becoming equal to the third threshold voltage). The signal transition from the first signal level to the second signal level may be performed, for example, as a rising edge signal transition, a falling edge signal transition, or a signal pulse.

The charging of the voltage charging devices 370u, 370v, and 370w is initiated at the start time Tstart by the PWM drive signal provided to one of the low-side transistors 309u, 309v, or 309w. Thus, the first charging time T1 is defined as a first duration from the start time Tstart to a time at which the first charging voltage Vbs_U is charged to the first threshold voltage. The second charging time T2 is defined as a second duration from the start time Tstart to a time at which the second charging voltage Vbs_V is charged to the second threshold voltage. The third charging time T3 is defined as a third duration from the start time Tstart to a time at which the third charging voltage Vbs_W is charged to the third threshold voltage.

In this way, the first, the second, and the third charging times T1, T2, and T3 can be detected and compared to determine if a short circuit condition is present. For example, if a time difference Tdiff1 between the first and the second charging times T1 and T2 is less than a time difference threshold Tth (e.g., T2−T1<Tth) or if a time difference Tdiff2 between the first and the third charging times T1 and T3 is less than the time difference threshold Tth (e.g., T3−T1<Tth), the short circuit condition is present. If the time difference Tdiff1 between the first and the second charging times T1 and T2 is equal to or greater than the time difference threshold Tth (e.g., T2−T1≥Tth) or if the time difference Tdiff2 between the first and the third charging times T1 and T3 is equal to or greater than the time difference threshold Tth (e.g., T3−T1≥Tth), the short circuit condition is not present and a normal operating condition can be detected.

As noted above, the voltage charging device 370u charges the fastest due to being associated with the low-side transistor (e.g., the low-side transistor 309u) that receives the PWM drive signal. As a result, the second and third changing times T2 and T3 are compared relative to the first charging time T1 to diagnose the short circuit condition. However, the second and third changing times T2 and T3 are not compared to each other to diagnose the short circuit condition when the PWM drive signal is applied to the low-side transistor 309u. On the other hand, if the PWM drive signal is applied to the low-side transistor 309v, the voltage charging device 370v charges the fastest and the first and third changing times T1 and T3 would be compared relative to the second charging time T2 (e.g., T1−T2 and T3−T2) to diagnose the short circuit condition. Similarly, if the PWM drive signal is applied to the low-side transistor 309w, the voltage charging device 370w charges the fastest and the first and second changing times T1 and T2 would be compared relative to the third charging time T3 (e.g., T1−T3 and T2−T3) to diagnose the short circuit condition.

As indicated above, FIG. 3B is provided merely as an example. Other examples are possible and may differ from what was described with regard to FIG. 3B. For example, in some implementations, the threshold voltages may be the same or may be different. In some implementations, the second and third charging times T2 and T3 may occur at different time instances. In some implementations, the charge time signals Trig_U, Trig_V, and Trig_W may have a different form to indicate one of the respective charging conditions (e.g., a threshold condition) being satisfied. In some implementations, a different type of varying drive signal may be used in place of the PWM drive signal.

Figure 3C:
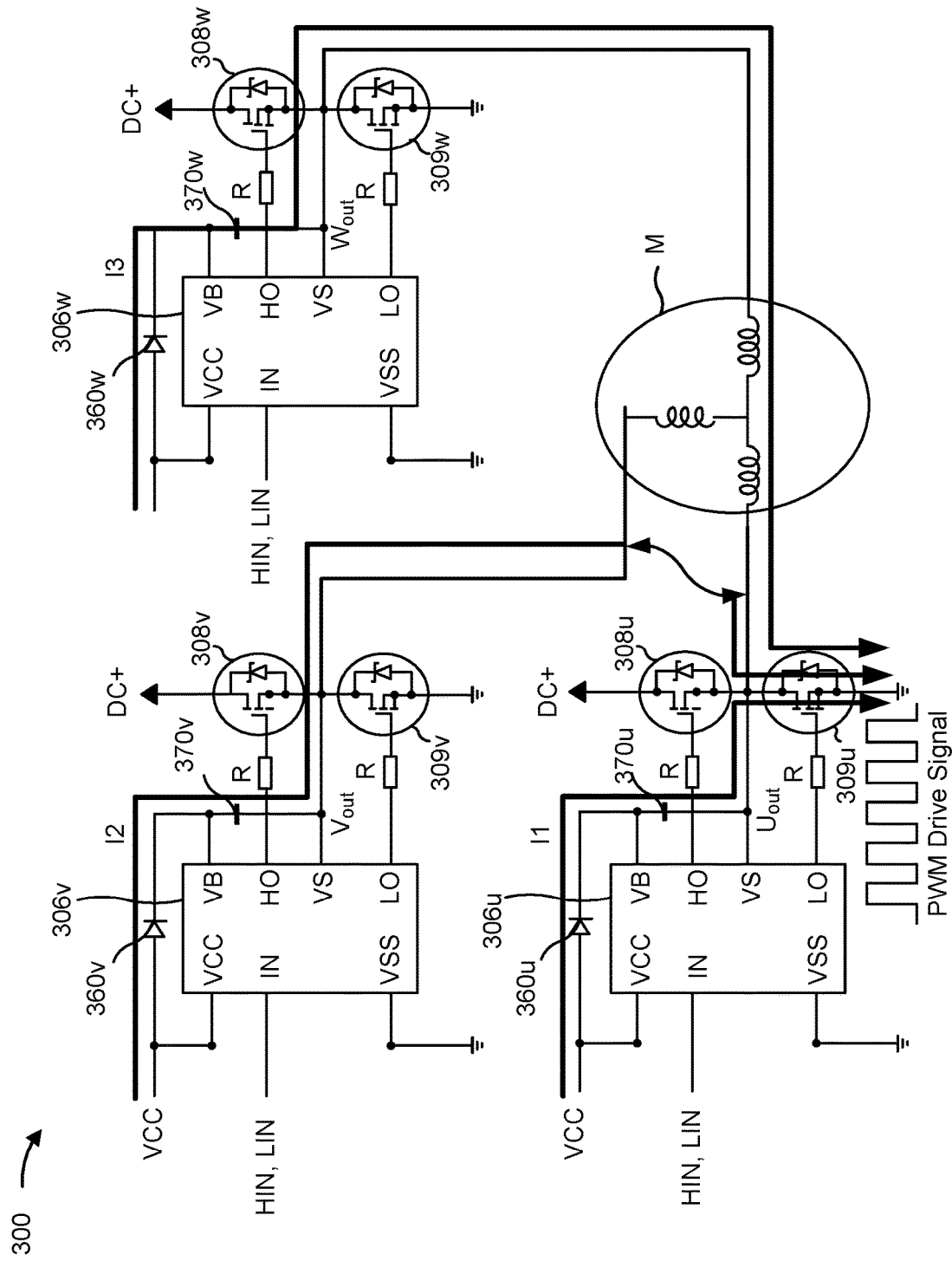
FIG. 3C illustrates a schematic diagram of the multi-phase gate driver system illustrated in FIG. 3A during which a short circuit condition is present according to one example.

FIG. 3C illustrates a schematic diagram of the multi-phase gate driver system 300 during which a short circuit condition is present according to one example. In this example, the output pads Uout and Vout are directly connected together (i.e., shorted together). The current I2 no longer flows through the motor windings of the motor M. As a result of the short circuit condition, the voltage charging device 370v charges more quickly than under a normal operating condition. Thus, the charging voltage Vbs_V of the voltage charging device 370v increases from the minimum voltage level to the second threshold voltage more quickly and the charge time signal Trig_V is triggered earlier (e.g., the second charging time T2 is closer to the start time Tstart and also closer to the first charging time T1). If the time difference Tdiff1 between the first and the second charging times T1 and T2 is less than a time difference threshold Tth (e.g., T2−T1<Tth), a short circuit condition can be detected and signaled to the controller 104. The controller 104 may then prevent startup of the motor M by maintaining the gate control signals to the high-side transistors 308u, 308v, and 308w at a low signal level to maintain the high-side transistors 308u, 308v, and 308w in an off state. In other words, PWM switching is not initiated for the high-side transistors 308u, 308v, and 308w. In this way, a short circuit cannot occur and can be prevented entirely, thereby preventing damage to the transistors 308u, 308v, 308w, 309u, 309v, and 309w. On the other hand, on a condition that the diagnostic circuit detects the normal operating condition, the diagnostic circuit is configured to enable PWM switching of the high-side transistors 308u, 308v, and 308w between respective switching states to start the motor M. PWM switching of the low-side transistors 309u, 309v, and 309w is also enable for starting the motor M.

As indicated above, FIG. 3C is provided merely as an example. Other examples are possible and may differ from what was described with regard to FIG. 3C. For example, in some implementations, the gate drivers 306u, 306v, and 306w may be arranged on a same IC. In some implementations, a short circuit may occur in a different location than a location illustrated. In some implementations, additional circuit components may be added without deviating from the disclosure provided above.

Figure 3D:
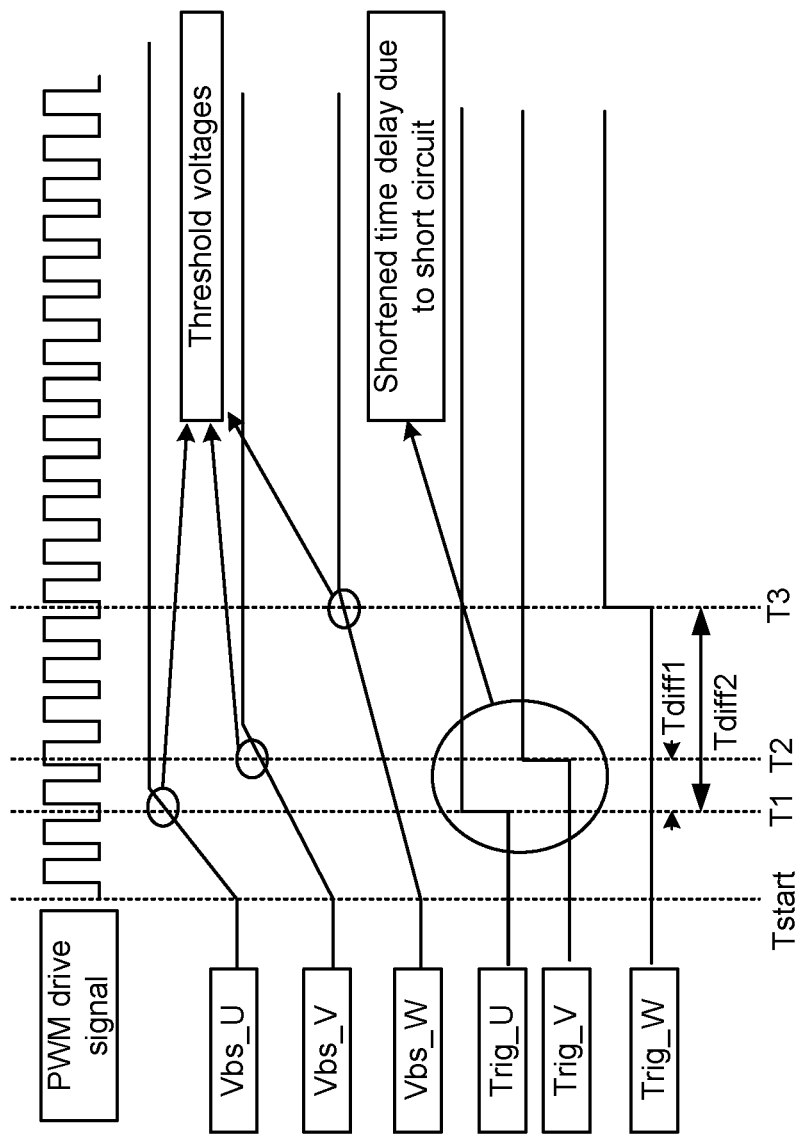
FIG. 3D illustrates a signal diagram of various signals present during a short circuit diagnostic operation according to an implementation illustrated in FIG. 3C during which a short circuit condition is present.

FIG. 3D illustrates a signal diagram of various signals present during a short circuit diagnostic operation according to an implementation illustrated in FIG. 3C during which a short circuit condition is present. The charge time signals Trig_U, Trig_V, and Trig_W indicate the first, the second, and the third charging times T1, T2, and T3, respectively. Due to the short circuit condition between output pads Uout and Vout, the charging voltage Vbs_V of the voltage charging device 370v increases from the minimum voltage level to the second threshold voltage more quickly and the charge time signal Trig_V is triggered earlier (e.g., the second charging time T2 is closer to the start time Tstart and also closer to the first charging time T2). In this case, the diagnostic circuit can determine that the time difference Tdiff1 between the first and the second charging times T1 and T2 is less than the time difference threshold Tth and that the short circuit condition between output pads Uout and Vout is present. The diagnostic circuit can also determine that the time difference Tdiff2 between the first and the third charging times T1 and T3 is equal to or greater than the time difference threshold Tth and that a short circuit condition between output pads Uout and Wout is not present.

Accordingly, the diagnostic circuit can discriminate a location of the short circuit condition within the multi-phase gate driver system 300, which can reduce diagnostic and repair time of a technician. In response to detecting a short circuit condition, the diagnostic circuit may signal a short circuit fault to the controller 104. The diagnostic circuit may indicate a fault location when signaling the short circuit fault by indicating which two phases have been shorted together. For example, if the time difference Tdiff1 between the first and the second charging times T1 and T2 is less than the time difference threshold Tth, the diagnostic circuit can signal in the short circuit fault that the short circuit condition is present between output pads Uout and Vout.

In response to receiving the signal indicating the short circuit fault, the controller 104 may then prevent startup of the motor M by maintaining the gate control signals to the high-side transistors 308u, 308v, and 308w at a low signal level to maintain the high-side transistors 308u, 308v, and 308w in an off state. In other words, PWM switching is not initiated for the high-side transistors 308u, 308v, and 308w. In this way, a short circuit cannot occur and can be prevented entirely, thereby preventing damage to the transistors 308u, 308v, 308w, 309u, 309v, and 309w. On the other hand, on a condition that the diagnostic circuit detects the normal operating condition, the diagnostic circuit is configured to enable PWM switching of the high-side transistors 308u, 308v, and 308w between respective switching states to start the motor M. PWM switching of the low-side transistors 309u, 309v, and 309w is also enable for starting the motor M. The controller 104 may also provide the fault location to an external device, for example, an external device used by a technician for repair.

As indicated above, FIG. 3D is provided merely as an example. Other examples are possible and may differ from what was described with regard to FIG. 3D. For example, in some implementations, the threshold voltages may be the same or may be different. In some implementations, the second and third charging times T2 and T3 may both indicate a short circuit. In some implementations, the charge time signals Trig_U, Trig_V, and Trig_W may have a different form to indicate one of the respective charging conditions (e.g., a threshold condition) being satisfied. In some implementations, a different type of varying drive signal may be used in place of the PWM drive signal.

Figure 4:
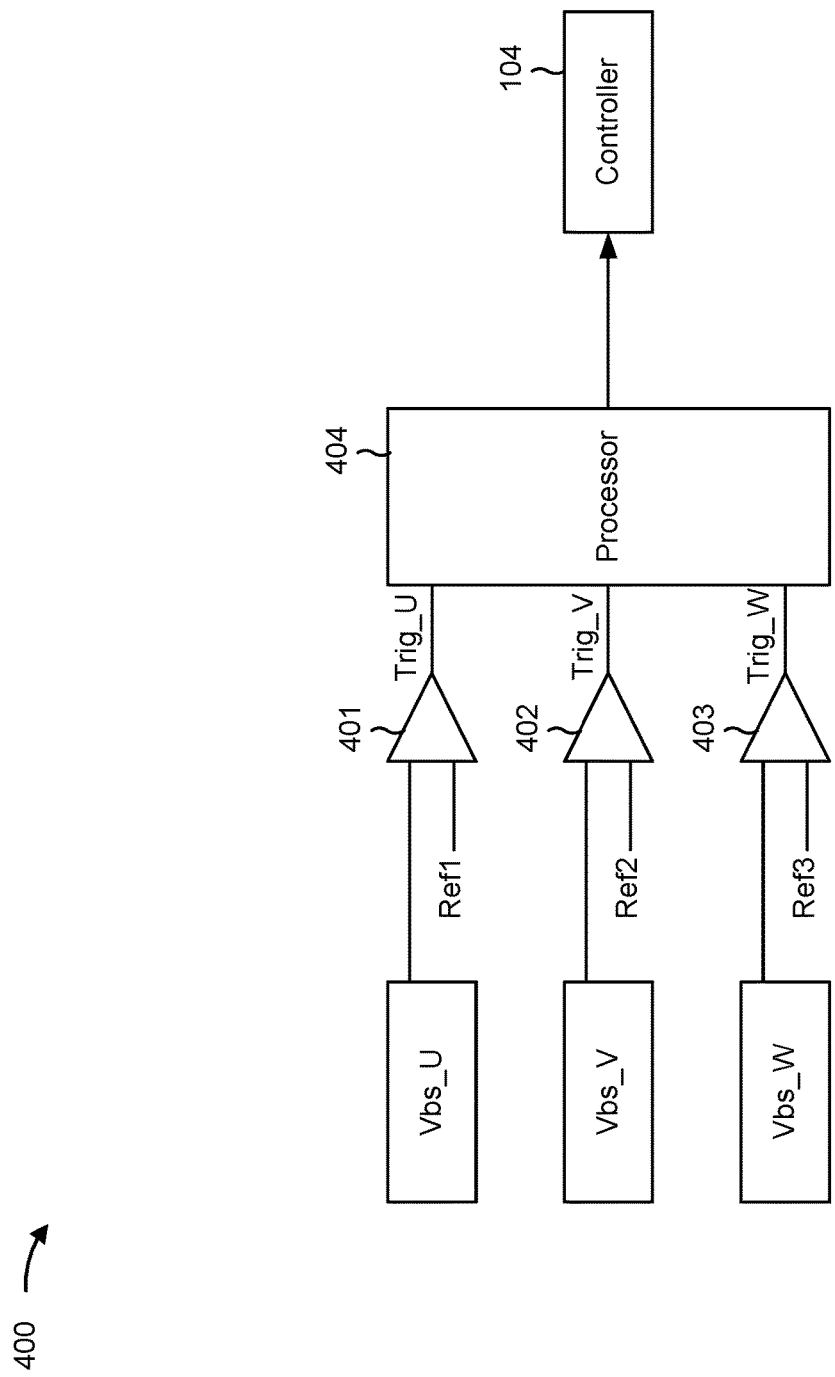
FIG. 4 illustrates a schematic diagram of a diagnostic circuit according to one or more implementations.

FIG. 4 illustrates a schematic diagram of a diagnostic circuit 400 according to one or more implementations. The controller 104 may be part of the diagnostic circuit 400. For example, the controller 104 may instruct the gate drivers 306u, 306v, and 306w to maintain five of the transistors 308u, 308v, 308w, 309u, 309v, and 309w in an off state and to provide one of the low-side transistors 309u, 309v, or 309w with the PWM drive signal during a short circuit diagnostic operation in the manner described above. The controller 104 may also initiate a further short circuit diagnostic operation during which the PWM drive signal is provided to a different one of the low-side transistors 309u, 309v, or 309w. By doing so, all possible locations for short circuit conditions can be tested to determine whether the entire multi-phase gate driver system (e.g., multi-phase gate driver system 300) is operating normally.

The diagnostic circuit 400 is connected to the voltage charging device 370u in order to measure the charging voltage Vbs_U of the voltage charging device 370u. For example, the diagnostic circuit 400 may be connected to terminal VB or to terminals VB and VS of the gate driver 306u to measure the charging voltage Vbs_U. Similarly, the diagnostic circuit 400 is connected to the voltage charging device 370v in order to measure the charging voltage Vbs_V of the voltage charging device 370v. For example, the diagnostic circuit 400 may be connected to terminal VB or to terminals VB and VS of the gate driver 306v to measure the charging voltage Vbs_V. Similarly, the diagnostic circuit 400 is connected to the voltage charging device 370w in order to measure the charging voltage Vbs_W of the voltage charging device 370w. For example, the diagnostic circuit 400 may be connected to terminal VB or to terminals VB and VS of the gate driver 306w to measure the charging voltage Vbs_W. Accordingly, the diagnostic circuit 400 can monitor the charging voltages Vbs_U, Vbs_V, and Vbs_W during the short circuit diagnostic operation to detect their respective charging times T1, T2, and T3.

The diagnostic circuit 400 can detect the charging times T1, T2, and T3 by comparing the charging voltages Vbs_U, Vbs_V, and Vbs_W during the short circuit diagnostic operation to respective first, second, and third threshold voltages Ref1, Ref2, and Ref3. The diagnostic circuit 400 may include comparators 401, 402, and 403 that trigger the charge time signals Trig_U, Trig_V, and Trig_W when a respective charging condition is satisfied. For example, the comparator 401 compares the charging voltage Vbs_U with the first threshold voltage Ref1 and triggers the charge time signal Trig_U when the charging voltage Vbs_U equals or is greater than the first threshold voltage Ref1. The comparator 402 compares the charging voltage Vbs_V with the second threshold voltage Ref2 and triggers the charge time signal Trig_V when the charging voltage Vbs_V equals or is greater than the second threshold voltage Ref2. The comparator 403 compares the charging voltage Vbs_W with the third threshold voltage Ref3 and triggers the charge time signal Trig_W when the charging voltage Vbs_W equals or is greater than the third threshold voltage Ref3. Thus, the comparison results of the comparators 401, 402, and 403 are used to detect the first, second, and third charging times T1, T2, and T3, respectively.

The diagnostic circuit 400 further includes a processor 404 that evaluates the first, second, and third charging times T1, T2, and T3 based on the charge time signals Trig_U, Trig_V, and Trig_W. For example, the processor 404 may calculate the time difference Tdiff1 between the first and the second charging times T1 and T2, calculate the time difference Tdiff2 between the first and third charging times T1 and T3, and determined if either of the time differences Tdiff1 or Tdiff2 is less than the time difference threshold Tth. If either of the time differences Tdiff1 or Tdiff2 is less than the time difference threshold Tth (e.g., based on respective comparison results), the processor 404 detects a short circuit condition and signals the short circuit fault to the controller 104 via a short circuit fault signal. In other words, the processor 404 detects the short circuit condition on a condition that the second charging time T2 or the third charging time T3 occurs at a time delay relative to the first charging time T1 that is less than the time difference threshold Tth. The processor 404 detects a normal operating condition on a condition that both the second charging time T2 and the third charging time T3 occur at respective time delays relative to the first charging time T1 that are equal to or greater than the time difference threshold Tth.

The processor 404 may indicate a fault location when signaling the short circuit fault by indicating which two phases have been shorted together. For example, if the time difference Tdiff1 between the first and the second charging times T1 and T2 is less than the time difference threshold Tth, the processor 404 can include fault information in the short circuit fault signal that the short circuit condition is present between output pads Uout and Vout.

Alternatively, as will be described in reference to FIGS. 5A and 5B, the processor 404 is configured to detect the short circuit condition on a condition that the processor 404 detects any two charging times T1 and T2, T1 and T3, or T2 and T3 within a predetermined time period Tjudge that extends from the start time Tstart. If only one of the charging times T1, T2, and T3 occurs within the predetermined time period Tjudge, the normal operating condition is present and can be detected by the processor 404.

As indicated above, FIG. 4 is provided merely as an example. Other examples are possible and may differ from what was described with regard to FIG. 4. For example, in some implementations, different types of components may be used to monitor the charging voltages Vbs_U, Vbs_V, and Vbs_W with respect to the first, second, and third threshold voltages Ref1, Ref2, and Ref3. Alternatively, monitoring of the charging voltages Vbs_U, Vbs_V, and Vbs_W with respect to the first, second, and third threshold voltages Ref1, Ref2, and Ref3 may be processor-based (e.g., performed by the processor 404). In some implementations, additional circuit components may be added without deviating from the disclosure provided above.

Figure 5A:
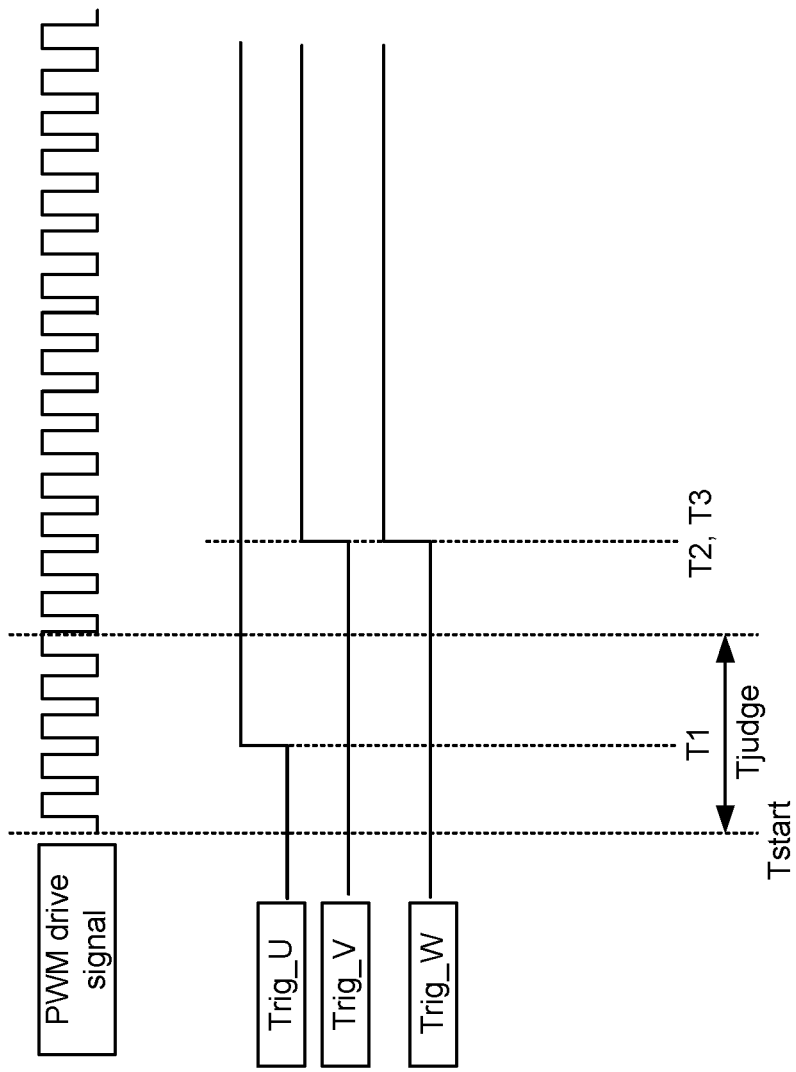
FIG. 5A illustrates a signal diagram of various signals present during a short circuit diagnostic operation according to an implementation illustrated in FIG. 3A during which no short circuit condition is present.

FIG. 5A illustrates a signal diagram of various signals present during a short circuit diagnostic operation according to an implementation illustrated in FIG. 3A during which no short circuit condition is present. Using an alternative evaluation method, the processor 404 is configured to evaluate the charging times T1, T2, and T3 with respect to the predetermined time period Tjudge that extends from the start time Tstart to a time later than the start time Tstart by a predefined duration. In this case, only the first charging time T1 occurs within the predetermined time period Tjudge and the second and third charging times T2 and T3 occur after the predetermined time period Tjudge has lapsed. Such a scenario indicates that the time delays of the second and the third charging times T2 and T3 relative to the first charging time T1 are sufficient for normal operation. In this scenario, the processor 404 detects a normal operating condition and may signal the normal operating condition to the controller 104 to enable the start of the motor M.

As indicated above, FIG. 5A is provided merely as an example. Other examples are possible and may differ from what was described with regard to FIG. 5A. For example, in some implementations, the second and third charging times T2 and T3 may occur at different time instances. In some implementations, the charge time signals Trig_U, Trig_V, and Trig_W may have a different form to indicate one of the respective charging conditions (e.g., a threshold condition) being satisfied. In some implementations, a different type of varying drive signal may be used in place of the PWM drive signal.

Figure 5B:
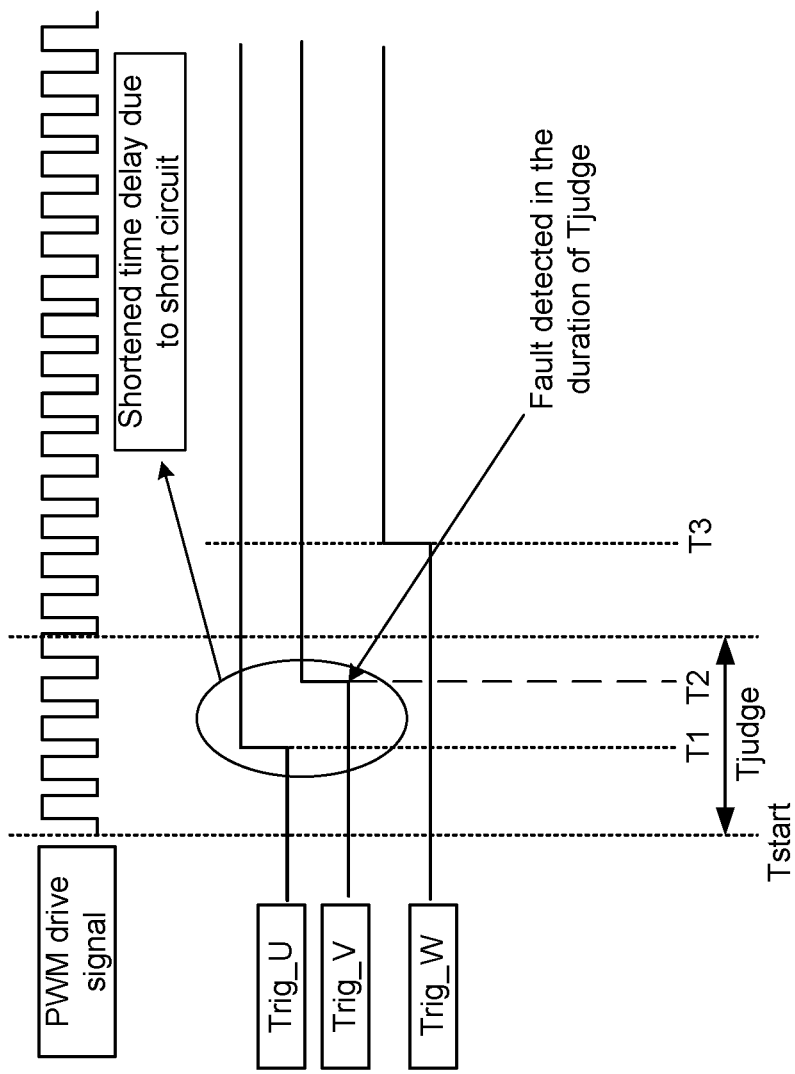
FIG. 5B illustrates a signal diagram of various signals present during a short circuit diagnostic operation according to an implementation illustrated in FIG. 3C during which a short circuit condition is present.

FIG. 5B illustrates a signal diagram of various signals present during a short circuit diagnostic operation according to an implementation illustrated in FIG. 3C during which a short circuit condition is present. Using the alternative evaluation method, the processor 404 is configured to evaluate the charging times T1, T2, and T3 with respect to the predetermined time period Tjudge that extends from the start time Tstart for a predefined duration. In this case, two charging times (e.g., the first charging time T1 and the second charging time T2) occur within the predetermined time period Tjudge. Such a scenario indicates that the time delay of the second third charging time T2 relative to the first charging time T1 is not sufficient for normal operation. The processor 404 can detect that the short circuit condition exists between output pads Uout and Vout and can signal a short circuit fault to the controller 104 to disable the start of the motor M.

As indicated above, FIG. 5B is provided merely as an example. Other examples are possible and may differ from what was described with regard to FIG. 5B. For example, in some implementations, the second and third charging times T2 and T3 may both indicate a short circuit. In some implementations, the charge time signals Trig_U, Trig_V, and Trig_W may have a different form to indicate one of the respective charging conditions (e.g., a threshold condition) being satisfied. In some implementations, a different type of varying drive signal may be used in place of the PWM drive signal.

Figure 6:
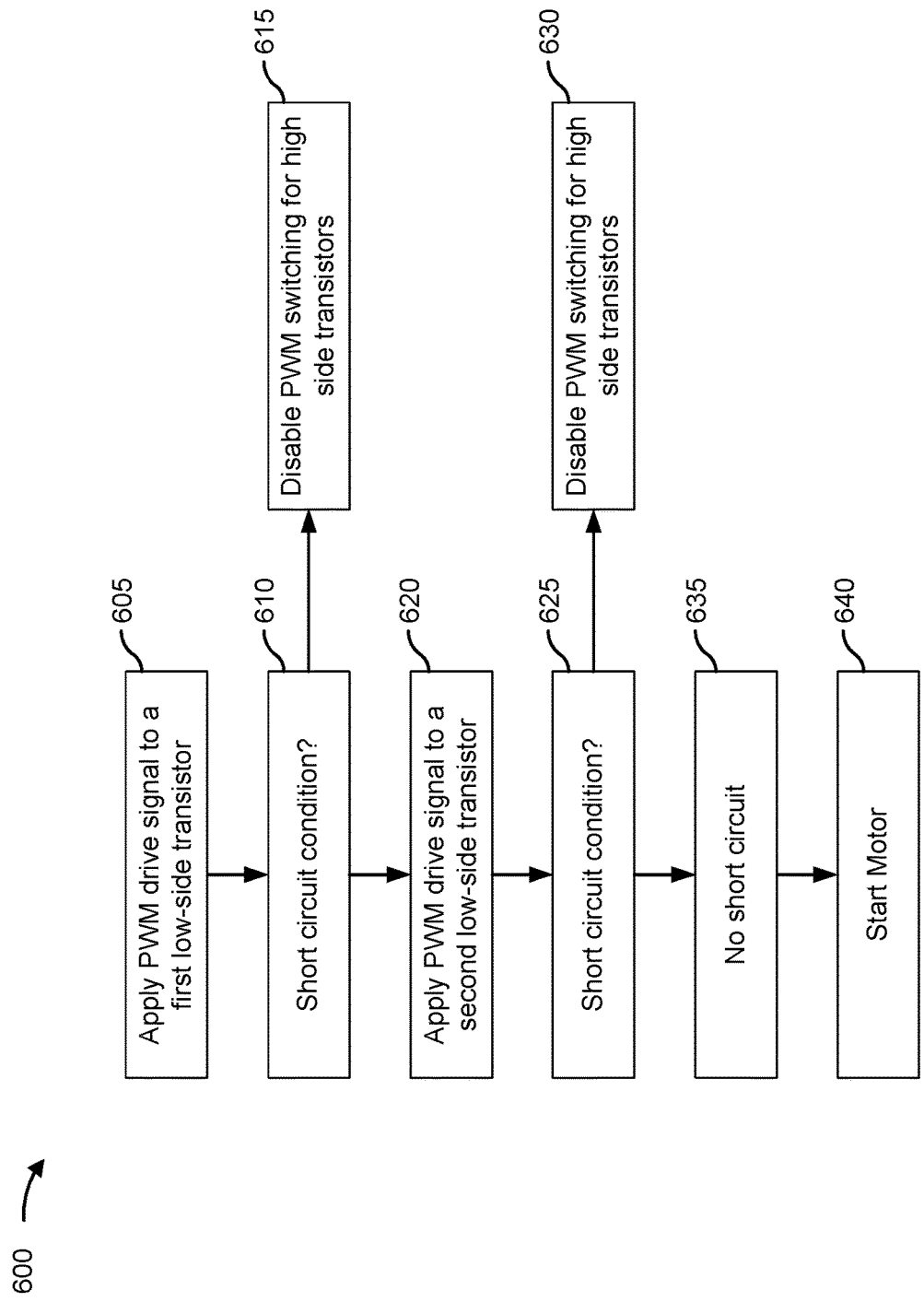
FIG. 6 illustrates a flow diagram of a method for detecting a short circuit condition in a multi-phase gate driver system prior to motor startup according to one or more implementations.

FIG. 6 illustrates a flow diagram of a method 600 for detecting for a short circuit condition in a multi-phase gate driver system prior to motor startup according to one or more implementations. In operation 605, a first PWM drive signal is applied to a first low-side transistor (e.g., one of the low-side transistors 309u, 309v, and 309w). In operation 610, it is determined whether a short circuit condition is detected while the first PWM drive signal is applied to a first low-side transistor. If the short circuit condition is detected in operation 610, PWM switching is disabled for the high-side transistors 308u, 308v, and 308w (operation 615). If the short circuit condition is not detected in operation 610, a second PWM drive signal is applied to a second low-side transistor (e.g., a different one of the low-side transistors 309u, 309v, and 309w) in operation 620. In operation 625, it is determined whether a short circuit condition is detected while the second PWM drive signal is applied to the second low-side transistor. If the short circuit condition is detected in operation 625, PWM switching is disabled for the high-side transistors 308u, 308v, and 308w (operation 630). If the short circuit condition is not detected in operation 625, it is determined that no short circuits are present in the multi-phase gate driver system (operation 635). In operation 640, the motor is started by enabling PWM switching for all transistors 308u, 308v, 308w, 309u, 309v, and 309w.

As indicated above, FIG. 6 is provided merely as an example. Other examples are possible and may differ from what was described with regard to FIG. 6. For example, in some implementations, additional steps may be added without deviating from the disclosure provided above.

Some aspects as described herein may be summarized as follows:

1. A driver system configured to drive a motor, the driver system comprising: a first half-bridge circuit comprising a first high-side transistor and a first low-side transistor coupled at a first output node, wherein the first high-side transistor and the first low-side transistor are configured to cooperatively generate a first load current at the first output node for driving the motor; a second half-bridge circuit comprising a second high-side transistor and a second low-side transistor coupled at a second output node, wherein the second high-side transistor and the second low-side transistor are configured to cooperatively generate a second load current at the second output node for driving the motor; a first voltage charging device coupled to a first power supply and to the first output node; a second voltage charging device coupled to a second power supply and to the second output node; and a diagnostic circuit configured to monitor a first charging voltage of the first voltage charging device and a second charging voltage of the second voltage charging device, detect a first charging time at which the first charging voltage is charged to a first threshold voltage, detect a second charging time at which the second charging voltage is charged to a second threshold voltage, and detect a short circuit condition on a condition that a time difference between the first charging time and the second charging time is less than a time difference threshold.

2. The driver system of any of the above aspects, wherein the diagnostic circuit is configured to detect a normal operating condition on a condition that the time difference between the first charging time and the second charging time is equal to or greater than the time difference threshold.

3. The driver system of any of the above aspects, wherein the diagnostic circuit is configured to detect the short circuit condition on a condition that the second charging time occurs at a time delay relative to the first charging time that is less than the time difference threshold.

4. The driver system of any of the above aspects, wherein the diagnostic circuit is configured to detect a normal operating condition on a condition that the second charging time occurs at a time delay relative to the first charging time that is equal to or greater than the time difference threshold.

5. The driver system of any of the above aspects, further comprising:
a driver circuit configured to generate control signals to drive the first high-side transistor, the first low-side transistor, the second high-side transistor, and the second low-side transistor between respective switching states, including at least an on state and an off state, wherein while the diagnostic circuit monitors the first charging voltage of the first voltage charging device and the second charging voltage of the second voltage charging device, the driver circuit is configured to maintain the first high-side transistor, the second high-side transistor, and the second low-side transistor in the off state and drive the first low-side transistor between the on state and the off state.

6. The driver system of any of the above aspects, wherein: wherein while the diagnostic circuit monitors the first charging voltage of the first voltage charging device and the second charging voltage of the second voltage charging device, the driver circuit is configured to generate one of the control signals as a varying drive signal and provide the varying drive signal to a control terminal of the first low-side transistor to drive the first low-side transistor between the on state and the off state.

7. The driver system of any of the above aspects, wherein the varying drive signal is a pulse-width modulation (PWM) drive signal.

8. The driver system of any of the above aspects, wherein the driver circuit is configured to start the varying drive signal at a start time, and wherein a charging of the first voltage charging device and a charging of the second voltage charging device start at the start time.

9. The driver system of any of the above aspects, wherein the diagnostic circuit is configured to determine the first charging time as a first duration from the start time to a first subsequent time at which the first charging voltage is charged to the first threshold voltage and determine the second charging time as a second duration from the start time to a second subsequent time at which the second charging voltage is charged to the second threshold voltage.

10. The driver system of any of the above aspects, wherein the driver circuit comprises: a first driver configured to generate the control signals to drive the first high-side transistor and the first low-side transistor between respective switching states; and a second driver configured to generate the control signals to drive the second high-side transistor and the second low-side transistor between respective switching states.

11. The driver system of any of the above aspects, wherein, while the first high-side transistor, the second high-side transistor, and the second low-side transistor are in the off state and while the first low-side transistor is driven between the on state and the off state, a first current is configured to flow from the first voltage charging device through the first output node, and through the first low-side transistor and a second current is configured to flow from the second voltage charging device, through the second output node, and through the first low-side transistor, wherein under a normal operating condition, the second current is configured to flow from the second output node to the first low-side transistor through motor windings of the motor, and wherein under a fault condition during which the short circuit condition is present, the second current is configured to flow from the second output node to the first low-side transistor via a short circuit.

12. The driver system of any of the above aspects, further comprising: a driver circuit configured to generate control signals to drive the first high-side transistor, the first low-side transistor, the second high-side transistor, and the second low-side transistor between respective switching states, including at least an on state and an off state, wherein while the diagnostic circuit monitors the first charging voltage of the first voltage charging device and the second charging voltage of the second voltage charging device, the driver circuit is configured to maintain the first high-side transistor, the second high-side transistor, and the second low-side transistor in an off state and drive the first low-side transistor between the on state and the off state, wherein the diagnostic circuit is configured to detect a normal operating condition on a condition that the time difference between the first charging time and the second charging time is equal to or greater than the time difference threshold, and wherein, on a condition that the diagnostic circuit detects the normal operating condition, the diagnostic circuit is configured to enable switching of the first high-side transistor and the second high-side transistor between respective switching states.

13. The driver system of any of the above aspects, wherein, on a condition that the diagnostic circuit detects the short circuit condition, the diagnostic circuit is configured to disable switching of the first high-side transistor and the second high-side transistor between respective switching states.

14. The driver system of any of the above aspects, wherein the diagnostic circuit includes a first comparator circuit configured to compare the first charging voltage to the first threshold voltage and generate a first comparison result and a second comparator circuit configured to compare the second charging voltage to the second threshold voltage and generate a second comparison result, wherein the diagnostic circuit detects the first charging time based on the first comparison result and detects the second charging time based on the second comparison result.

15. The driver system of any of the above aspects, where the diagnostic circuit is configured to calculate the time difference based on the first charging time and the second charging time, compare the time difference to the time difference threshold to generate a third comparison result, and detect the short circuit condition based on the third comparison result.

16. The driver system of any of the above aspects, further comprising: a driver circuit configured to generate control signals to drive the first high-side transistor, the first low-side transistor, the second high-side transistor, and the second low-side transistor between respective switching states, including at least an on state and an off state, wherein the driver circuit is configured to initiate a charging of the first voltage charging device and a charging of the second voltage charging device at a start time, wherein the diagnostic circuit is configured to detect the short circuit condition on a condition that the diagnostic circuit detects both the first charging time and the second charging time within a predetermined time period extending from the start time.

17. The driver system of any of the above aspects, wherein the diagnostic circuit is configured to detect a normal operating condition on a condition that the diagnostic circuit detects that the second charging time occurs at time equal to or later than the predetermined time period extending from the start time.

18. The driver system of any of the above aspects, wherein the first power supply and the second power supply are a same power supply.

19. The driver system of any of the above aspects, wherein the first voltage charging device is a first bootstrap capacitor and the second voltage charging device is a second bootstrap capacitor.

20. The driver system of any of the above aspects, wherein the first charging voltage is representative of a voltage across the first bootstrap capacitor and the second charging voltage is representative of a voltage across the second bootstrap capacitor.

21. The driver system of any of the above aspects, further comprising: a first driver configured to drive the first high-side transistor and the first low-side transistor between respective switching states; and a second driver configured to drive the second high-side transistor and the second low-side transistor between respective switching states, wherein the first charging voltage is a first high-side floating supply voltage of the first driver and the second charging voltage is a second high-side floating supply voltage of the second driver.

22. The driver system of any of the above aspects, further comprising: a third half-bridge circuit comprising a third high-side transistor and a third low-side transistor coupled at a third output node, wherein the third high-side transistor and the third low-side transistor are configured to cooperatively generate a third load current at the third output node for driving the motor; and a third voltage charging device coupled to a third power supply and to the third output node, wherein the diagnostic circuit is configured to monitor the first charging voltage of the first voltage charging device, the second charging voltage of the second voltage charging device, and a third charging voltage of the third voltage charging device, detect the first charging time at which the first charging voltage is charged to the first threshold voltage, detect the second charging time at which the second charging voltage is charged to the second threshold voltage, detect the third charging time at which the third charging voltage is charged to a third threshold voltage, and detect the short circuit condition on a condition that a first time difference between the first charging time and the second charging time is less than the time difference threshold or on a condition that a second time difference between the first charging time and the third charging time is less than the time difference threshold.

23. The driver system of any of the above aspects, wherein the diagnostic circuit is configured to detect a normal operating condition on a condition that the first time difference and the second time difference are both equal to or greater than the time difference threshold.

24. The driver system of any of the above aspects, further comprising: a driver circuit configured to generate control signals to drive the first high-side transistor, the first low-side transistor, the second high-side transistor, the second low-side transistor, the third high-side transistor, and the third low-side transistor between respective switching states, including at least an on state and an off state, wherein while the diagnostic circuit monitors the first charging voltage of the first voltage charging device and the second charging voltage of the second voltage charging device, the driver circuit is configured to maintain the first high-side transistor, the second high-side transistor, the third high-side transistor, the second low-side transistor, and the third low-side transistor in an off state and drive the first low-side transistor between the on state and the off state, and wherein, on a condition that the diagnostic circuit detects the normal operating condition, the diagnostic circuit is configured to enable switching of the first high-side transistor, the second high-side transistor, and the third high-side transistor between respective switching states.

25. The driver system of any of the above aspects, wherein, on a condition that the diagnostic circuit detects the short circuit condition, the diagnostic circuit is configured to disable switching of the first high-side transistor, the second high-side transistor, and the third high-side transistor between respective switching states.

26. The driver system of any of the above aspects, wherein the first power supply, the second power supply, and the third power supply are a same power supply.

27. The driver system of any of the above aspects, wherein, on a condition that the diagnostic circuit detects the short circuit condition, the diagnostic circuit is configured to generate a short circuit fault signal that indicates a fault location of the short circuit condition.

28. A method of detecting a short circuit condition in a driver system comprising a first half-bridge circuit configured to generate a first load current at a first output node, a second half-bridge circuit configured to generate a second load current at a second output node, a first voltage charging device coupled to a first power supply and to the first output node, and a second voltage charging device coupled to a second power supply and to the second output node, the method comprising: monitoring a first charging voltage of the first voltage charging device and a second charging voltage of the second voltage charging device; detecting a first charging time at which the first charging voltage is charged to a first threshold voltage; detecting a second charging time at which the second charging voltage is charged to a second threshold voltage; and detecting the short circuit condition on a condition that a time difference between the first charging time and the second charging time is less than a time difference threshold.

29. The method of aspect 28, further comprising: detecting a normal operating condition on a condition that the time difference between the first charging time and the second charging time is equal to or greater than the time difference threshold.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A driver system configured to drive a motor, the driver system comprising:
    a first half-bridge circuit comprising a first high-side transistor and a first low-side transistor coupled at a first output node, wherein the first high-side transistor and the first low-side transistor are configured to cooperatively generate a first load current at the first output node for driving the motor;
    a second half-bridge circuit comprising a second high-side transistor and a second low-side transistor coupled at a second output node, wherein the second high-side transistor and the second low-side transistor are configured to cooperatively generate a second load current at the second output node for driving the motor;
    a first voltage charging device coupled to a first power supply and to the first output node;
    a second voltage charging device coupled to a second power supply and to the second output node; and
    a diagnostic circuit configured to monitor a first charging voltage of the first voltage charging device and a second charging voltage of the second voltage charging device, detect a first charging time at which the first charging voltage is charged to a first threshold voltage, detect a second charging time at which the second charging voltage is charged to a second threshold voltage, and detect a short circuit condition on a condition that a time difference between the first charging time and the second charging time is less than a time difference threshold.

2. The driver system of claim 1, wherein the diagnostic circuit is configured to detect a normal operating condition on a condition that the time difference between the first charging time and the second charging time is equal to or greater than the time difference threshold.

3. The driver system of claim 1, wherein the diagnostic circuit is configured to detect the short circuit condition on a condition that the second charging time occurs at a time delay relative to the first charging time that is less than the time difference threshold.

4. The driver system of claim 3, wherein the diagnostic circuit is configured to detect a normal operating condition on a condition that the second charging time occurs at a time delay relative to the first charging time that is equal to or greater than the time difference threshold.

5. The driver system of claim 1, further comprising:
a driver circuit configured to generate control signals to drive the first high-side transistor, the first low-side transistor, the second high-side transistor, and the second low-side transistor between respective switching states, including at least an on state and an off state,
wherein while the diagnostic circuit monitors the first charging voltage of the first voltage charging device and the second charging voltage of the second voltage charging device, the driver circuit is configured to maintain the first high-side transistor, the second high-side transistor, and the second low-side transistor in the off state and drive the first low-side transistor between the on state and the off state.

6. The driver system of claim 5, wherein:
wherein while the diagnostic circuit monitors the first charging voltage of the first voltage charging device and the second charging voltage of the second voltage charging device, the driver circuit is configured to generate one of the control signals as a varying drive signal and provide the varying drive signal to a control terminal of the first low-side transistor to drive the first low-side transistor between the on state and the off state.

7. The driver system of claim 6, wherein the varying drive signal is a pulse-width modulation (PWM) drive signal.

8. The driver system of claim 6, wherein the driver circuit is configured to start the varying drive signal at a start time, and wherein a charging of the first voltage charging device and a charging of the second voltage charging device start at the start time.

9. The driver system of claim 8, wherein the diagnostic circuit is configured to determine the first charging time as a first duration from the start time to a first subsequent time at which the first charging voltage is charged to the first threshold voltage and determine the second charging time as a second duration from the start time to a second subsequent time at which the second charging voltage is charged to the second threshold voltage.

10. The driver system of claim 5, wherein the driver circuit comprises:
a first driver configured to generate the control signals to drive the first high-side transistor and the first low-side transistor between respective switching states; and
a second driver configured to generate the control signals to drive the second high-side transistor and the second low-side transistor between respective switching states.

11. The driver system of claim 5, wherein, while the first high-side transistor, the second high-side transistor, and the second low-side transistor are in the off state and while the first low-side transistor is driven between the on state and the off state, a first current is configured to flow from the first voltage charging device through the first output node, and through the first low-side transistor and a second current is configured to flow from the second voltage charging device, through the second output node, and through the first low-side transistor,
wherein under a normal operating condition, the second current is configured to flow from the second output node to the first low-side transistor through motor windings of the motor, and
wherein under a fault condition during which the short circuit condition is present, the second current is configured to flow from the second output node to the first low-side transistor via a short circuit.

12. The driver system of claim 1, further comprising:
a driver circuit configured to generate control signals to drive the first high-side transistor, the first low-side transistor, the second high-side transistor, and the second low-side transistor between respective switching states, including at least an on state and an off state,
wherein while the diagnostic circuit monitors the first charging voltage of the first voltage charging device and the second charging voltage of the second voltage charging device, the driver circuit is configured to maintain the first high-side transistor, the second high-side transistor, and the second low-side transistor in an off state and drive the first low-side transistor between the on state and the off state,
wherein the diagnostic circuit is configured to detect a normal operating condition on a condition that the time difference between the first charging time and the second charging time is equal to or greater than the time difference threshold, and
wherein, on a condition that the diagnostic circuit detects the normal operating condition, the diagnostic circuit is configured to enable switching of the first high-side transistor and the second high-side transistor between respective switching states.

13. The driver system of claim 1, wherein, on a condition that the diagnostic circuit detects the short circuit condition, the diagnostic circuit is configured to disable switching of the first high-side transistor and the second high-side transistor between respective switching states.

14. The driver system of claim 1, wherein the diagnostic circuit includes a first comparator circuit configured to compare the first charging voltage to the first threshold voltage and generate a first comparison result and a second comparator circuit configured to compare the second charging voltage to the second threshold voltage and generate a second comparison result, wherein the diagnostic circuit detects the first charging time based on the first comparison result and detects the second charging time based on the second comparison result.

15. The driver system of claim 14, where the diagnostic circuit is configured to calculate the time difference based on the first charging time and the second charging time, compare the time difference to the time difference threshold to generate a third comparison result, and detect the short circuit condition based on the third comparison result.

16. The driver system of claim 1, further comprising:
a driver circuit configured to generate control signals to drive the first high-side transistor, the first low-side transistor, the second high-side transistor, and the second low-side transistor between respective switching states, including at least an on state and an off state, wherein the driver circuit is configured to initiate a charging of the first voltage charging device and a charging of the second voltage charging device at a start time, wherein the diagnostic circuit is configured to detect the short circuit condition on a condition that the diagnostic circuit detects both the first charging time and the second charging time within a predetermined time period extending from the start time.

17. The driver system of claim 16, wherein the diagnostic circuit is configured to detect a normal operating condition on a condition that the diagnostic circuit detects that the second charging time occurs at time equal to or later than the predetermined time period extending from the start time.

18. The driver system of claim 1, wherein the first power supply and the second power supply are a same power supply.

19. The driver system of claim 1, wherein the first voltage charging device is a first bootstrap capacitor and the second voltage charging device is a second bootstrap capacitor.

20. The driver system of claim 19, wherein the first charging voltage is representative of a voltage across the first bootstrap capacitor and the second charging voltage is representative of a voltage across the second bootstrap capacitor.

21. The driver system of claim 19, further comprising:
a first driver configured to drive the first high-side transistor and the first low-side transistor between respective switching states; and
a second driver configured to drive the second high-side transistor and the second low-side transistor between respective switching states,
wherein the first charging voltage is a first high-side floating supply voltage of the first driver and the second charging voltage is a second high-side floating supply voltage of the second driver.

22. The driver system of claim 1, further comprising:
a third half-bridge circuit comprising a third high-side transistor and a third low-side transistor coupled at a third output node, wherein the third high-side transistor and the third low-side transistor are configured to cooperatively generate a third load current at the third output node for driving the motor; and
a third voltage charging device coupled to a third power supply and to the third output node,
wherein the diagnostic circuit is configured to monitor the first charging voltage of the first voltage charging device, the second charging voltage of the second voltage charging device, and a third charging voltage of the third voltage charging device, detect the first charging time at which the first charging voltage is charged to the first threshold voltage, detect the second charging time at which the second charging voltage is charged to the second threshold voltage, detect the third charging time at which the third charging voltage is charged to a third threshold voltage, and detect the short circuit condition on a condition that a first time difference between the first charging time and the second charging time is less than the time difference threshold or on a condition that a second time difference between the first charging time and the third charging time is less than the time difference threshold.

23. The driver system of claim 22, wherein the diagnostic circuit is configured to detect a normal operating condition on a condition that the first time difference and the second time difference are both equal to or greater than the time difference threshold.

24. The driver system of claim 23, further comprising:
a driver circuit configured to generate control signals to drive the first high-side transistor, the first low-side transistor, the second high-side transistor, the second low-side transistor, the third high-side transistor, and the third low-side transistor between respective switching states, including at least an on state and an off state,
wherein while the diagnostic circuit monitors the first charging voltage of the first voltage charging device and the second charging voltage of the second voltage charging device, the driver circuit is configured to maintain the first high-side transistor, the second high-side transistor, the third high-side transistor, the second low-side transistor, and the third low-side transistor in an off state and drive the first low-side transistor between the on state and the off state, and
wherein, on a condition that the diagnostic circuit detects the normal operating condition, the diagnostic circuit is configured to enable switching of the first high-side transistor, the second high-side transistor, and the third high-side transistor between respective switching states.

25. The driver system of claim 24, wherein, on a condition that the diagnostic circuit detects the short circuit condition, the diagnostic circuit is configured to disable switching of the first high-side transistor, the second high-side transistor, and the third high-side transistor between respective switching states.

26. The driver system of claim 22, wherein the first power supply, the second power supply, and the third power supply are a same power supply.

27. The driver system of claim 22, wherein, on a condition that the diagnostic circuit detects the short circuit condition, the diagnostic circuit is configured to generate a short circuit fault signal that indicates a fault location of the short circuit condition.

28. A method of detecting a short circuit condition in a driver system comprising a first half-bridge circuit configured to generate a first load current at a first output node, a second half-bridge circuit configured to generate a second load current at a second output node, a first voltage charging device coupled to a first power supply and to the first output node, and a second voltage charging device coupled to a second power supply and to the second output node, the method comprising:
monitoring a first charging voltage of the first voltage charging device and a second charging voltage of the second voltage charging device;
detecting a first charging time at which the first charging voltage is charged to a first threshold voltage;
detecting a second charging time at which the second charging voltage is charged to a second threshold voltage; and
detecting the short circuit condition on a condition that a time difference between the first charging time and the second charging time is less than a time difference threshold.

29. The method of claim 28, further comprising:
detecting a normal operating condition on a condition that the time difference between the first charging time and the second charging time is equal to or greater than the time difference threshold.

* * * * *